US006642714B2

United States Patent
Kobayashi et al.

(10) Patent No.: US 6,642,714 B2
(45) Date of Patent: Nov. 4, 2003

(54) THIN-FILM MAGNETIC FIELD SENSOR

(75) Inventors: Nobukiyo Kobayashi, Natori (JP);
Takeshi Yano, Sendai (JP); Shigehiro Ohnuma, Sendai (JP); Kiwamu Shirakawa, Sendai (JP); Tsuyoshi Masumoto, Sendai (JP)

(73) Assignee: The Research Institute for Electric and Magnetic Materials, Sendai (JP)

( * ) Notice: Subject to any disclaimer, the term of this patent is extended or adjusted under 35 U.S.C. 154(b) by 0 days.

(21) Appl. No.: 10/225,794

(22) Filed: Aug. 22, 2002

(65) Prior Publication Data
US 2003/0042902 A1 Mar. 6, 2003

Related U.S. Application Data

(63) Continuation of application No. PCT/JP01/09385, filed on Oct. 25, 2001.

(30) Foreign Application Priority Data

| Oct. 26, 2000 | (JP) | 2000-367822 |
| Sep. 5, 2001 | (JP) | 2001-316084 |
| Oct. 12, 2001 | (JP) | 2001-315935 |

(51) Int. Cl.$^7$ .................. G01R 33/09; G01R 33/025; G01R 35/00
(52) U.S. Cl. .................. 324/252; 324/225; 338/32 R; 428/692
(58) Field of Search .................. 324/249, 252, 324/207.21, 225; 338/32 R; 360/324.1; 428/692

(56) References Cited

U.S. PATENT DOCUMENTS

| 5,422,621 A | * 6/1995 | Gambino et al. | 338/32 R |
| 5,475,304 A | * 12/1995 | Prinz | 324/207.21 |
| 5,552,949 A | * 9/1996 | Hashimoto et al. | 360/327.32 |
| 5,561,368 A | * 10/1996 | Dovek et al. | 324/252 |
| 6,184,680 B1 | * 2/2001 | Shinoura et al. | 324/252 |

(List continued on next page.)

FOREIGN PATENT DOCUMENTS

| EP | 0 989 411 A2 | 3/2000 |
| JP | 43-12473 | 5/1948 |
| JP | 6-148301 A | 5/1994 |
| JP | 7-043389 A | 2/1995 |
| JP | 8-075835 A | 3/1996 |

(List continued on next page.)

OTHER PUBLICATIONS

Parker et al. "Overview of Progress in Giant Magnetoresistive Sensors Based on NiFe/Ag Multilayers," IEEE Transactions on Magnetics, vol. 32, No. 1, Jan. 1996 pp. 142–148.*

(List continued on next page.)

*Primary Examiner*—N. Le
*Assistant Examiner*—Darrell Kinder
(74) *Attorney, Agent, or Firm*—Frishauf, Holtz, Goodman & Chick, P.C.

(57) ABSTRACT

A thin-film magnetic field sensor is provided which includes two arms of a bridge circuit formed of a first element having a giant-magneto-resistant thin-film, and soft magnetic thin-films disposed one on either side thereof, with electrical terminals, and a second element having a giant-magneto-resistant thin-film, and conductive films disposed one on either side thereof, with electrical terminals. The electrical resistance value of the second element has sensitivity relative to the magnetic field, such that it is substantially zero when the magnetic field is small, but it changes equally to the first element due to causes other than the magnetic field. Since the output of the bridge circuit is in proportion to the difference in electrical resistance values between the first and second elements, part of a change due to causes other than the magnetic field is canceled in the output of the bridge circuit, whereby the magnetic field value can be accurately measured.

19 Claims, 27 Drawing Sheets

U.S. PATENT DOCUMENTS

| | | | |
|---|---|---|---|
| 6,232,775 B1 * | 5/2001 | Naitoh et al. | 324/249 |
| 6,270,588 B1 * | 8/2001 | Takano et al. | 148/108 |
| 6,339,329 B1 * | 1/2002 | Neumann et al. | 324/252 |
| 6,384,600 B1 * | 5/2002 | Coehoorn | 324/252 |
| 6,472,868 B1 * | 10/2002 | Takayama et al. | 324/249 |

FOREIGN PATENT DOCUMENTS

| | | |
|---|---|---|
| JP | 9-033257 A | 2/1997 |
| JP | 11-087804 A | 3/1999 |
| JP | 11-109006 A | 4/1999 |
| JP | 11-274599 A | 10/1999 |
| JP | 2000-055997 A | 2/2000 |

OTHER PUBLICATIONS

Kobayashi et al. "(Fe–Co)–(MG–fluoride) insulating nanogranular system with enhanced tunnel–type giant magnetoresistance," Journal of Applied Physics, vol. 90, No. 8, Oct. 15, 2001, pp. 4159–4162.*

* cited by examiner

THIN-FILM MAGNETIC FIELD SENSOR

This application is a continuation application of International Application PCT/JP01/09385, filed Oct. 25, 2001.

TECHNICAL FIELD

The present invention relates to a thin-film magnetic field sensor for measuring a magnetic field in a space, and particularly to a thin-film magnetic field sensor for precisely measuring the degree and direction of a magnetic field, using a giant-magneto-resistant thin-film, such as a nano-granular giant-magneto-resistance effect thin-film.

BACKGROUND ART

FIG. 1 shows a magnetic field sensor disclosed in Jpn. Pat. Appln. KOKAI Publication Nos. 11-87804 and 11-274599. In FIG. 1, the portion indicated with "Giant-magneto-resistant thin-film" denotes a nano-granular giant-magneto-resistant thin-film of "Metal-Insulator", which renders an electrical resistance change of about 10% when a magnetic field of 10 k Oe is applied. As in this example, giant-magneto-resistant thin-films have a larger range of change in the electrical resistance value, as compared to ordinary magneto-resistance effect materials. However, as described above, they require a large applied magnetic field to cause an electrical resistance change. Accordingly, where a giant-magneto-resistant thin-film is solely used, hardly any change in the electrical resistance value can be expected with a small magnetic field of about 100 Oe or less, which is generally used in magnetic field sensors.

The structure shown in FIG. 1 is arranged to compensate for the problem described above. Specifically, there are soft magnetic thin-films, which function as members for gathering magnetic flux around them. Where the dimensions of the soft magnetic thin-films are appropriately selected, the giant-magneto-resistant thin-film can be supplied with any degree of large magnetic flux density within the saturation magnetic flux density of the soft magnetic thin-films, regardless of the degree of the magnetic field around the soft magnetic thin-films, in principle. Furthermore, seeing the structure shown in FIG. 1 from the point of view of electrical resistance, although the electrical resistance value between the soft magnetic thin-films is the sum of those of soft magnetic thin-film portions and a giant-magneto-resistant thin-film portion, the resistance value between the soft magnetic thin-films is substantially equal to the resistance value of the giant-magneto-resistant thin-film portion, because the giant-magneto-resistant thin-film has a high electrical resistivity, which is 100 times or more that of the soft magnetic thin-films. In other words, the electrical resistance value of the giant-magneto-resistant thin-film directly takes on the electrical resistance value between the soft magnetic thin-films. FIG. 2 shows an example of change in electrical resistance in the structure shown in FIG. 1. As shown in FIG. 2, a change of about 6% in the electrical resistance value is realized with a small magnetic field of several Oe. This change is twice or more larger than those of anisotropic magneto-resistance effect materials, which are conventionally used.

However, it has been found that the structure shown in FIG. 1 brings about a big problem, where it is used to realize a magnetic field sensor for measuring the absolute value of an applied magnetic field on the basis of a measurement value of the electrical resistance of the giant-magneto-resistant thin-film. The problem relates to change in the magneto-resistance value of the giant-magneto-resistant thin-film due to temperature. As described above, in the case of the structure shown in FIG. 1, there is freedom of choice in the degree of a magnetic field to be detected. However, even if the sensitivity is increased, it is a choice relative to a magnetic field to respond, and it is impossible to obtain a range of change larger than change in the electrical resistance of the giant-magneto-resistant thin-film, in principal. Actually, in the case of the structure shown in FIG. 1, the change value in electrical resistance has been reduced due to other factors as well as that describe above, and becomes about 6%. If a change of the giant-magneto-resistant thin-film due to temperature is added to the change value of about 6% in electrical resistance, the additional change in electrical resistance for that can be a variable in estimating an applied magnetic field. FIG. 3 shows examples of a temperature characteristic. As shown in FIG. 3, change in the resistance value of the giant-magneto-resistant thin-film due to temperature is larger than change in the resistance value due to the applied magnetic field. Accordingly, the structure shown in FIG. 1, as it is, can be hardly used as a magnetic field sensor for measuring the absolute value of a magnetic field.

Furthermore, it has also been found that the conventional structure shown in FIG. 1 brings about a big problem, where it is used to realize a magnetic field sensor for measuring the absolute value and direction of an applied magnetic field. That is, change in the electrical resistance of the giant-magneto-resistant thin-film does not depend on the direction of a magnetic field, but has an isotropic characteristic. Specifically, as shown in FIG. 2, the structure shown in FIG. 1 provides the same change in electrical resistance in positive and negative directions of a magnetic field, and thus the direction of the magnetic field is hardly specified. Accordingly, the structure shown in FIG. 1, as it is, can be used as a sensor for only detecting the degree of a magnetic field, but cannot be used as a sensor for specifying the direction of the magnetic field, such as an azimuth sensor for reading the direction of geomagnetism, or a sensor for reading an angle relative to a polarized magnetic material.

An object of the present invention is to provide a thin-film magnetic field sensor, which has a simple structure and a high detecting sensitivity, and reduces measurement errors due to temperature variation or the like, and can measure the intensity and direction of a magnetic field.

DISCLOSURE OF INVENTION

At first, the present invention provides a thin-film magnetic field sensor comprising: a first arm including soft magnetic thin-films, which are separated by a gap having a predetermined gap length, and each have a predetermined film thickness and a predetermined width at a portion in contact with the gap, a giant-magneto-resistant thin-film formed to fill the gap between the soft magnetic thin-films, and terminals respectively and electrically connected to the two separated soft magnetic thin-films; and a second arm including conductive films, which are separated by a gap having a gap length substantially equal to said gap length, and each have a film thickness substantially equal to said film thickness and a width substantially equal to said width at a portion in contact with the gap, a giant-magneto-resistant thin-film formed to fill the gap between the conductive films, and terminals respectively and electrically connected to the two separated conductive films, wherein these arms form two arms of a bridge circuit.

Specifically, according to the present invention, in the electrical resistance value changes of a giant-magnetoresistant thin-film, changes due to temperature, humidity and time-varying are removed, and only a change due to a magnetic field is extracted, so that a magnetic field sensor with a high accuracy is realized. More specifically, a bridge is formed of two lines of elements, which have the same giant-magneto-resistant thin-film and structure, wherein one of the elements includes soft magnetic thin-films one on either side of the giant-magneto-resistant thin-film to increase the sensitivity relative to the magnetic field, and the other element uses the giant-magneto-resistant thin-film as it is to make the sensitivity substantially zero relative to the magnetic field. Since the output of the bridge is in proportion to the difference in the electrical resistance value between the elements, changes of the giant-magneto-resistant thin-film due to temperature, as well as other changes due to humidity, time-varying, etc. are removed from the output voltage, whereby only an electrical resistance value change due to a magnetic field appears in the output. As a result, it is possible to accurately detect the absolute value of the magnetic field, and also to detect a very small magnetic field.

Where two first arms each having soft magnetic thin-films one on either side of a giant-magneto-resistant thin-film, and two second arms each having conductive films one on either side of a giant-magneto-resistant thin-film are disposed to form a bridge circuit, the bridge output voltage can be twice that of the structure according to the first invention, whereby it is possible to realize a thin-film magnetic field sensor with a higher accuracy and a higher sensitivity to the magnetic field.

The present invention also improves the accuracy of a thin-film magnetic field sensor, in terms of used materials. Specifically, where giant-magneto-resistant thin-films used in elements forming a bridge have the same material and structure, but materials sandwiching the giant-magneto-resistant thin-films are different, a small difference may be brought about in the electrical resistance value, depending on contact potential difference, thermally electromotive force, etc. With an arrangement according to a third invention, electrical resistance changes of the giant-magneto-resistant thin-films due to causes including problems describe above other than a magnetic field applied to the two structures are strictly canceled, whereby it is possible to realize a thin-film magnetic field sensor with a still higher accuracy.

The present invention also realizes a thin-film magnetic field sensor with a more compact size and a higher accuracy, in terms of the structure. Specifically, in order to increase the sensitivity of a magnetic field sensor and to also make its shape compact, it is necessary for a structure, which has soft magnetic thin-films one on either side of a giant-magneto-resistant thin-film, to have the soft magnetic thin-films compact while maintaining a constant effective area of the soft magnetic thin-films. With an arrangement according to a fourth invention, it is possible to realize a thin-film magnetic field sensor with a high sensitivity and a compact shape.

The present invention also improves the accuracy of a thin-film magnetic field sensor, in terms of residual magnetization. Specifically, where there is residual magnetization in soft magnetic thin-films after an applied magnetic field is measured and the external magnetic field is removed, the residual magnetization has an effect on a giant-magneto-resistant thin-film similarly to an externally applied magnetic field, which lowers accuracy in detecting the magnetic field. Accordingly, where the soft magnetic thin-films are magnetized in a direction perpendicular to a detection magnetic field of the giant-magneto-resistant thin-film, residual magnetization in the soft magnetic thin-films is reduced, so that a magnetic field can be measured more accurately.

At second, the present invention provides a thin-film magnetic field sensor comprising: a magnetic field sensor element including soft magnetic thin-films, which are separated by a gap having a predetermined gap length, and each have a predetermined film thickness and a predetermined width at a portion in contact with the gap, and a giant-magneto-resistant thin-film formed to fill the gap; and a magnetic field generator configured to apply a bias magnetic field to the magnetic field sensor element.

Specifically, the magnetic field zero point in an electrical resistance change curve is arbitrarily shifted by applying the bias magnetic field, in order to create a difference in the electrical resistance change between positive and negative directions because of a difference in the magnetic field to be measured between positive and negative directions (polarities). With this arrangement, since there is a difference in the sensor output depending on the direction of a magnetic field, it is possible to determine the direction of the magnetic field. Furthermore, where a bias magnetic field corresponding to a magnetic field with the largest change in the electrical resistance change curve is applied, the sensitivity of the sensor is improved, as compared to the case where no bias magnetic field is applied.

Where a coil is used, the degree of the bias magnetic field is easily controlled by adjusting a current flowing in the coil. On the other hand, where a device has a small sensor, which hardly allows a coil to be formed, a soft magnetic thin-film and a hard magnetic film having a predetermined degree of coercive force may be stacked one on the other, so that a bias magnetic field is applied to a magnetic field sensor element by the hard magnetic film.

In a thin-film magnetic field sensor according to the present invention, internal distortions and stresses are left when films are formed. Accordingly, problems arise such that the sensor does not show the expected performance and noises become large. These problems in properties are solved, where a heat treatment is performed at a temperature of 50° C. or more and 500° C. or less after the film formation, so that the internal distortions and stresses are removed. Where the temperature is lower than 50° C., the internal distortions and stresses are not sufficiently removed, while, where it is higher than 500° C., properties of soft magnetic thin-films or a giant-magneto-resistant thin-film are deteriorated, and thus such temperatures are not appropriate.

Particularly, a magnetic field generator may be a coil would around soft magnetic thin-films and a giant-magneto-resistant thin-film. A magnetic field formed by a current flowing in this air-cored coil only follows Biot-Savart law, and thus a constant magnetic field can be always applied, in spite of temperature or time-varying, so long as the coil has a stable shape. With reference to the magnetic field with an accurate value, the intensity of a magnetic field therearound can be determined. In this case, the coil may be formed of a linear conductor or a thin-film conductor. With the coil, the direction of a magnetic field to be applied to the soft magnetic thin-films and giant-magneto-resistant thin-film can be selected by changing the direction of the flowing current between positive and negative directions. The direction of a magnetic field therearound can be determined with reference to this.

As regards means for detecting the resistance value between electrical terminals in a thin-film magnetic field sensor according to the present invention, which includes a coil would around soft magnetic thin-films and a giant-magneto-resistant thin-film, the resistance value may not be directly measured, but the measurement of the resistance value may be replaced with measurement of voltage, which is easier, using an arrangement where electrical terminals are disposed on one arm of a bridge circuit to measure a bridge output voltage.

A coil wound around soft magnetic thin-films and a giant-magneto-resistant thin-film can be realized, using a technique for a conductive thin-film wound around the soft magnetic thin-films and giant-magneto-resistant thin-film. By applying the technique for a conductive thin-film, a coil is realized to be close to the soft magnetic thin-films and giant-magneto-resistant thin-film. Since the intensity of a magnetic field generated when a current is caused to flow in the coil is in reverse proportion to the distance relative to the coil, the necessary current value to apply a predetermined magnetic field intensity to the soft magnetic thin-films and giant-magneto-resistant thin-film can be reduced, as the coil is closer. Since a current flowing in the coil is a dominant factor in the power consumption of the sensor, it is possible by this coil technique to realize a compact magnetic field sensor with a low power consumption.

Current values flowing in a coil would around soft magnetic thin-films and a giant-magneto-resistant thin-film film are selected to comprise two currents in positive and negative directions, which have substantially the same absolute value within a range where magnetization of the soft magnetic thin-films and giant-magneto-resistant thin-film does not reach saturation. The intensity and direction of a magnetic field are determined based on a difference in the resistance value between the cases of these currents being caused to flow. With this arrangement, fluctuations in the absolute value of the resistance value are removed by difference in the resistance value. Since the sign of the difference in the resistance value agrees with the sign of an externally applied magnetic field, the direction of the magnetic field can be easily determined.

Where a current flowing in a coil wound around soft magnetic thin-films and a giant-magneto-resistant thin-film has a value to substantially saturate the soft magnetic thin-films and giant-magneto-resistant thin-film, the value of a residual magnetic field becomes a forcedly decided magnetization value, and thus measurement errors due to residual magnetization can be solved.

The present invention also shows a specific arrangement to determine the accurate value and direction of an external magnetic field and to solve errors due to residual magnetization at the same time. Specifically, at first, a positive direction current, which substantially saturates the soft magnetic thin-films and giant-magneto-resistant thin-film, is caused to flow in the coil. With this operation, existing magnetization is solved and magnetization in one direction is forcedly provided in the soft magnetic thin-films and giant-magneto-resistant thin-film. Then, the current is continuously reduced from the value for saturation to a predetermined positive current value within a range which does not provide saturation, and, in this sate, a resistance value Rpp is measured between terminals. Then, the current value is continuously changed to a predetermined negative current value, and, in this sate, a resistance value Rpm is measured between the terminals. Then, a negative direction current, which substantially saturates the soft magnetic thin-films and giant-magneto-resistant thin-film, is caused to flow in the coil. With this operation, the magnetization described above is solved and magnetization in the opposite direction is forcedly provided in the soft magnetic thin-films and giant-magneto-resistant thin-film. Then, a predetermined negative current value within a range which does not provide saturation is applied, and, in this sate, a resistance value Rmm is measured between the terminals. Then, the current value is continuously changed to a predetermined positive current value, and, in this state, a resistance value Rmp is measured between the terminals. The absolute value and polarity of the intensity of a magnetic field around the magnetic field sensor are determined by ((Rpm+Rmm)/2−(Rpp+Rmp)/2) derived from the resistance values thus obtained, so that the accurate value and direction of an external magnetic field can be determined, while removing the influence of magnetization.

BEST MODE FOR CARRYING OUT THE INVENTION

First Embodiment

Figure 4:
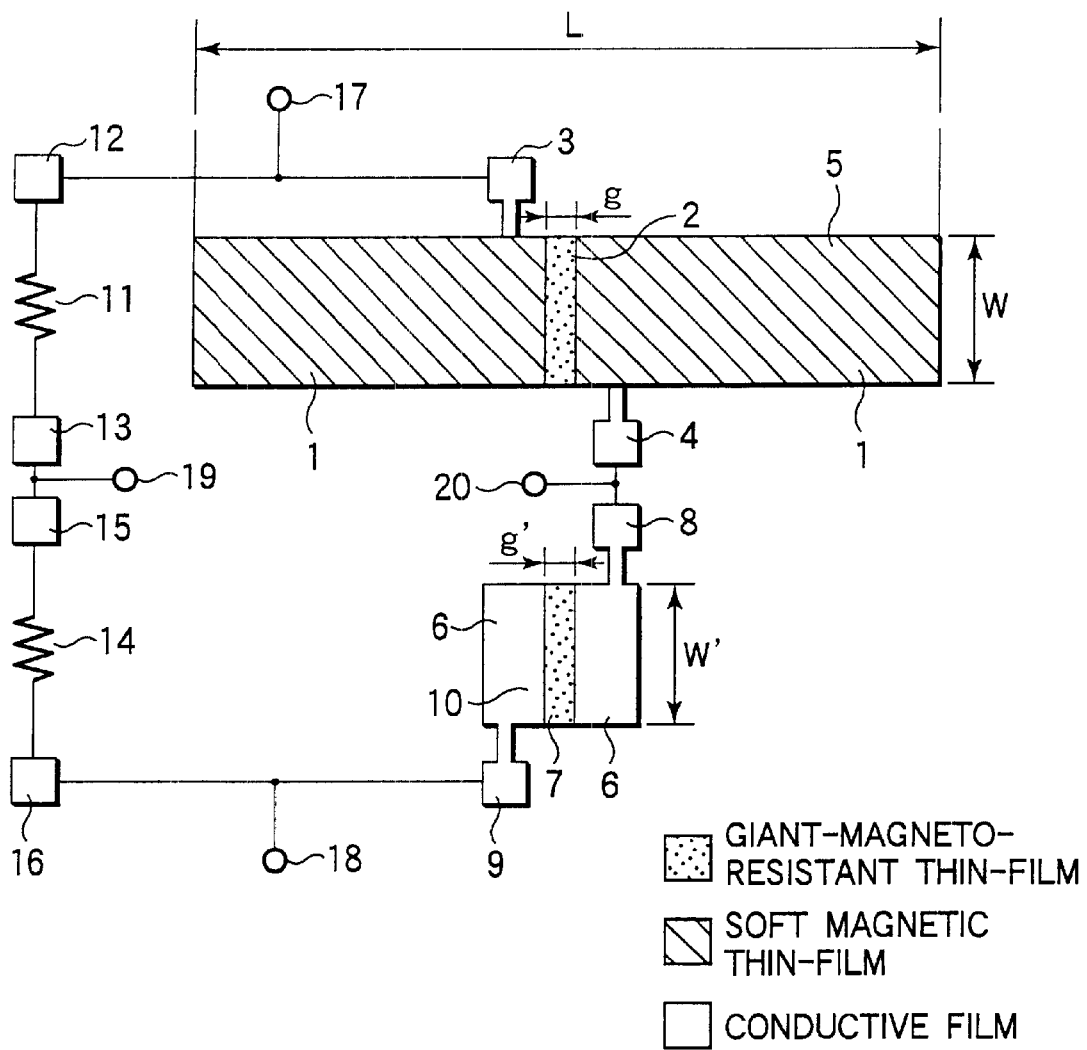
FIG. 4 is a circuit diagram showing a thin-film magnetic field sensor according to a first embodiment of the present invention, where a bridge circuit is constructed by four arms, i.e., resistors 11 and 14, an element 5 formed by sandwiching a giant-magneto-resistant thin-film between soft magnetic thin-films, and an element 10 formed by sandwiching a giant-magneto-resistant thin-film between conductive films.

FIG. 4 shows a first embodiment of the present invention. In FIGS. 1 to 13, the part corresponding to a giant-magneto-resistant thin-film is shown with dots, the part corresponding to a soft magnetic thin-film is shown with diagonal lines, and the part corresponding to a conductive thin-film is shown with a blank.

Figure 1:
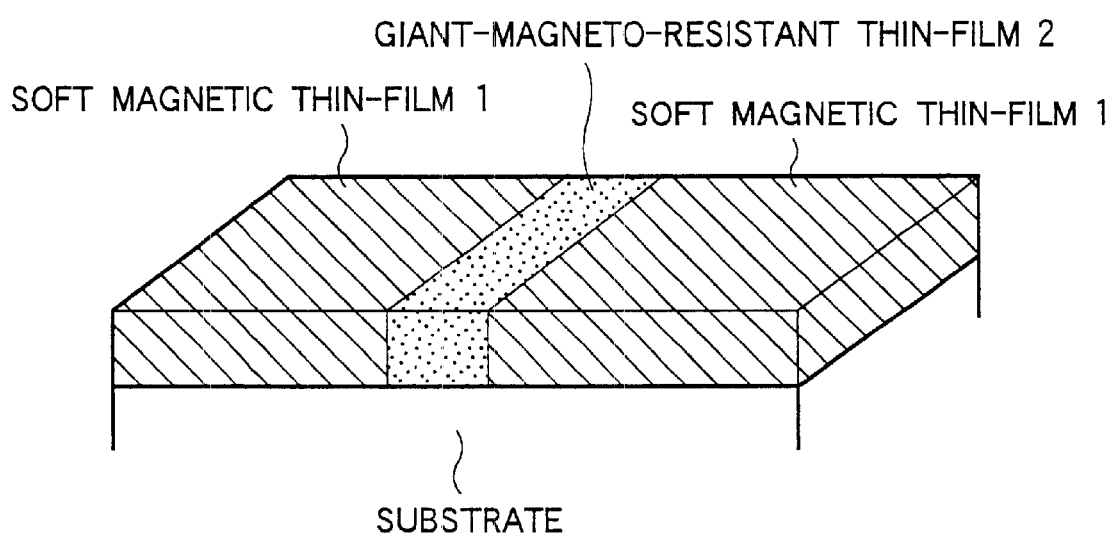
FIG. 1 is an oblique view showing a conventional thin-film magnetic field sensor.
Figure 2:
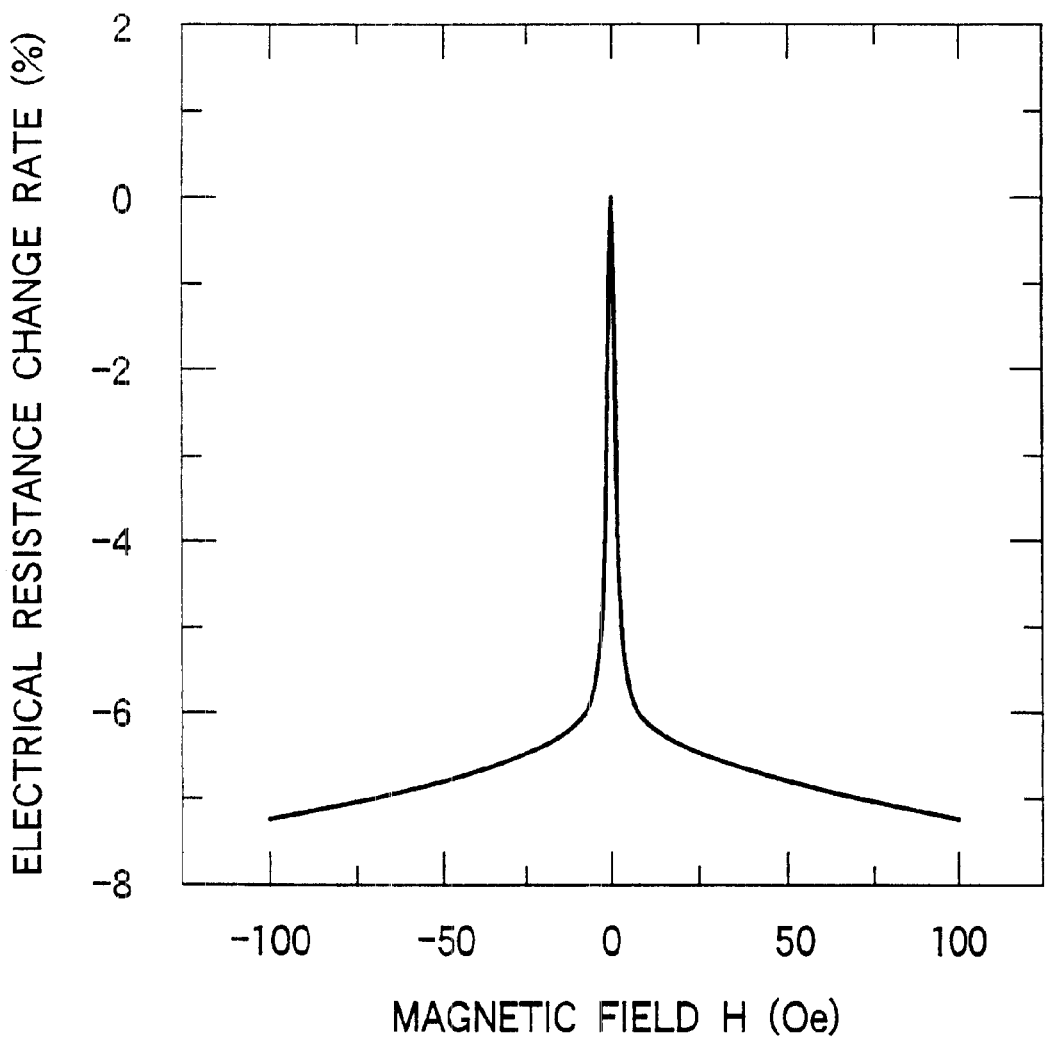
FIG. 2 is a graph showing the relationship between the electrical resistance change rate and the applied magnetic field in the conventional thin-film magnetic field sensor shown in FIG. 1.
Figure 3:
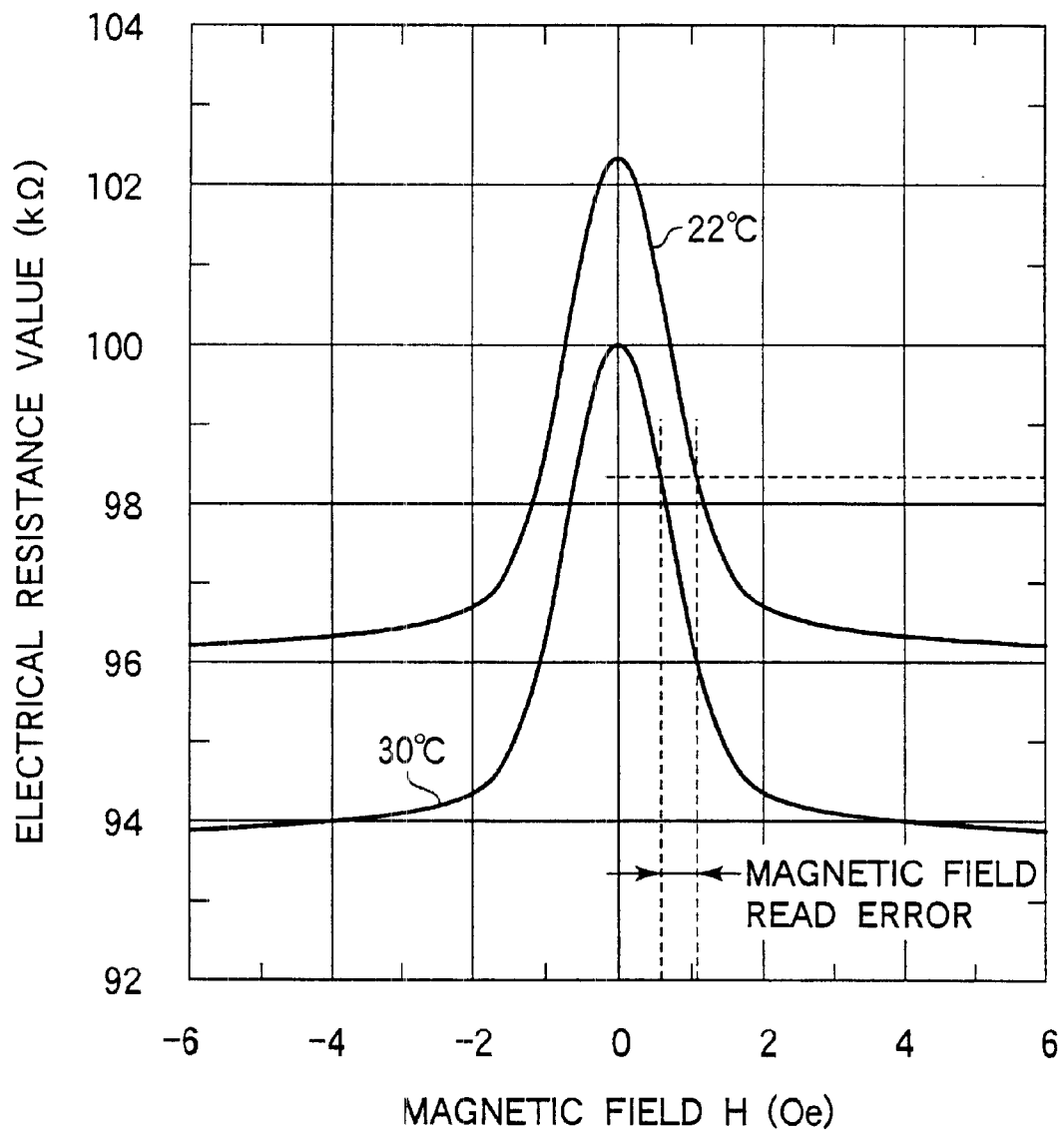
FIG. 3 a graph showing the relationship between the electrical resistance of a giant-magneto-resistant thin-film and the applied magnetic field, using temperature as a parameter, in the conventional thin-film magnetic field sensor shown in FIG. 1.

Reference symbol 5 denotes an element including soft magnetic thin-films 1, a giant-magneto-resistant thin-film 2, and electrical terminals 3 and 4, which is the same as the conventional structure shown in FIG. 1. Since the function of the element 5 is described in the column of Background Art, a description will be given only of the concrete content of the present invention, to avoid repetitive explanation.

Reference symbol 1 denotes soft magnetic thin-films formed of Permalloy, which has a high saturation magnetic flux density of 15 kG or more, and a low coercive force of 0.5 Oe or less. Typical materials, including the material describe above and another material, for the soft magnetic thin-films 1 and their properties are shown in Table 1.

TABLE 1

| Material Name | Coercive Force (Oe) | Saturation Magnetic Flux Density (kG) | Electrical Resistivity ($\mu \Omega$ cm) |
|---|---|---|---|
| Permalloy ® ($Fe_{66}Ni_{34}$) | 0.4 | 17 | 82 |
| $Co_{77}Fe_6Si_9B_8$ | 0.07 | 12 | 130 |

The thickness of the soft magnetic thin-films 1 is 1 $\mu$m. The soft magnetic thin-films 1 is provided with a gap therebetween, indicated with a gap length g. The gap length is 1 $\mu$m. The width W of the soft magnetic thin-films 1 in contact with the gap is 100 $\mu$m. The giant-magneto-resistant thin-film 2 is formed to fill the gap between the soft magnetic thin-films 1. The material of the giant-magneto-resistant thin-film 2 is $Co_{39}Y_{14}O_{47}$. Typical materials, including the material describe above and other materials, usable for the giant-magneto-resistant thin-film 2 and their properties are shown in Table 2.

TABLE 2

| Material Name | Electrical Resistance Chance Rate (10 kOe, %) | Magnetic Permeability (Absolute Number) | Electrical Resistivity ($\mu \Omega$ cm) |
|---|---|---|---|
| Co—Al—O | 9 | 12 | $5 \times 10^5$ |
| $Co_{39}Y_{14}O_{47}$ | 7 | 11 | $1.4 \times 10^5$ |
| Fe—Mg—F | 8 | 10 | $9 \times 10^8$ |
| (Fe—Co)—Mg—F | 14 | 30 | $2 \times 10^9$ |

The thickness t of the soft magnetic thin-films 1, the gap length g, and the width W of the soft magnetic thin-films 1 in contact with the gap should be chosen to satisfy characteristics required from both magnetic conditions and electrical conditions. The present invention is characterized by obtaining required characteristics in a wide range. Specifically, the range of choices of dimensions is very wide. With regard to magnetic conditions, where the gap length g is too large, e.g., it is several times or more the thickness t of the soft magnetic thin-films 1, the soft magnetic thin-films 1 gather magnetic flux around them and prevent the magnetic flux from being sufficiently concentrated onto the gap portion. On the other hand, even where the thickness t of the soft magnetic thin-films 1 is far large, it can provide the function necessary for the present invention. However, the thickness has a limit determined by practical constraints, such that an apparatus for forming the soft magnetic thin-films 1 has a certain ability to perform deposition per unit of time, or the soft magnetic thin-films 1 may come off a substrate due to a stress caused when the soft magnetic thin-films 1 is formed on the substrate. In reverse, where the thickness t of the soft magnetic thin-films 1 is 10 nm or less, the magnetic property of the soft magnetic thin-films 1 deteriorates, and thus 10 nm is substantially the lower limit of the thickness t. With regard to electrical conditions, the width W of the soft magnetic thin-films 1 should be set in consideration of the matters that the magnetic field sensor can be compact, and the absolute value of the electrical resistance falls in a range of, e.g., from several 10 kΩ to several 100 MΩ, which a peripheral circuit can easily deal with. The absolute value of the electrical resistance is in proportion to the electrical resistivity of the giant-magneto-resistant thin-film 2 and the gap length a, and in inverse proportion to the width W and the thickness t of the soft magnetic thin-films 1, and thus its freedom of design is relatively large. Accordingly, the width W of the soft magnetic thin-films may fall in a wide range of from the maximum of several mm to the minimum of several μm. connected to the soft magnetic thin-films 1 on both sides separated by the gap. The material of the electrical terminal portions has no significant magnetic effect, and thus can be determined in consideration mainly of electrical conductivity. They may be formed of a material common to the soft magnetic thin-films 1, or provided with a Cu film only at surface portions to be connected to the external portions.

Figure 5:
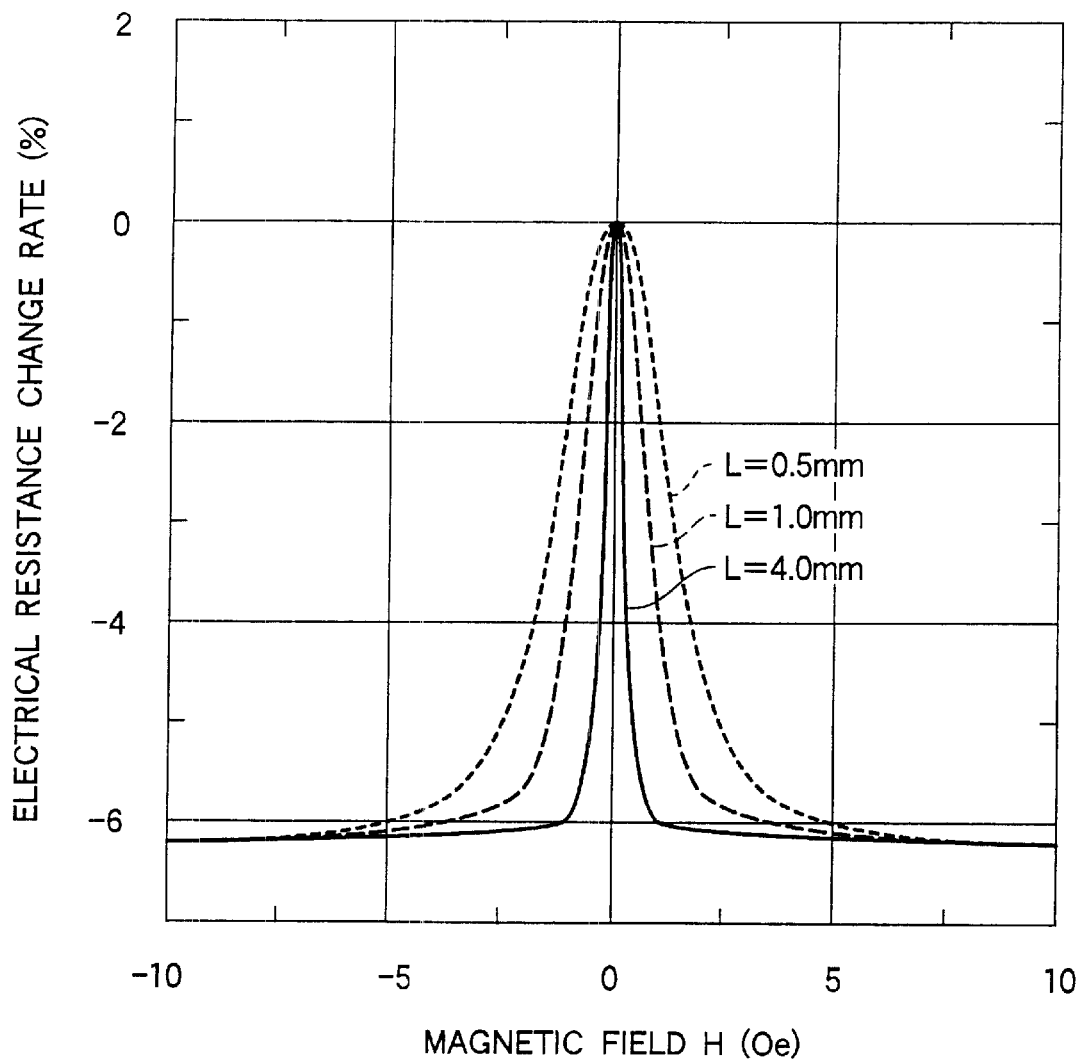
FIG. 5 is a graph showing the relationship between the electrical resistance change rate of the element 5 and the applied magnetic field in the thin-film magnetic field sensor according to the first embodiment of the present invention.

FIG. 5 shows an example of the relationship between the electrical resistance value change of the element 5 and the applied magnetic field, using the length L of the soft magnetic thin-films 1 as a parameter; from which it is understood that, with an increase in the length L, a smaller magnetic field can be detected. The relationship between the applied magnetic field and the electrical resistance value has a linear relation until a certain degree of the magnetic field, where the absolute value of the applied magnetic field is taken into consideration.

Figure 6:
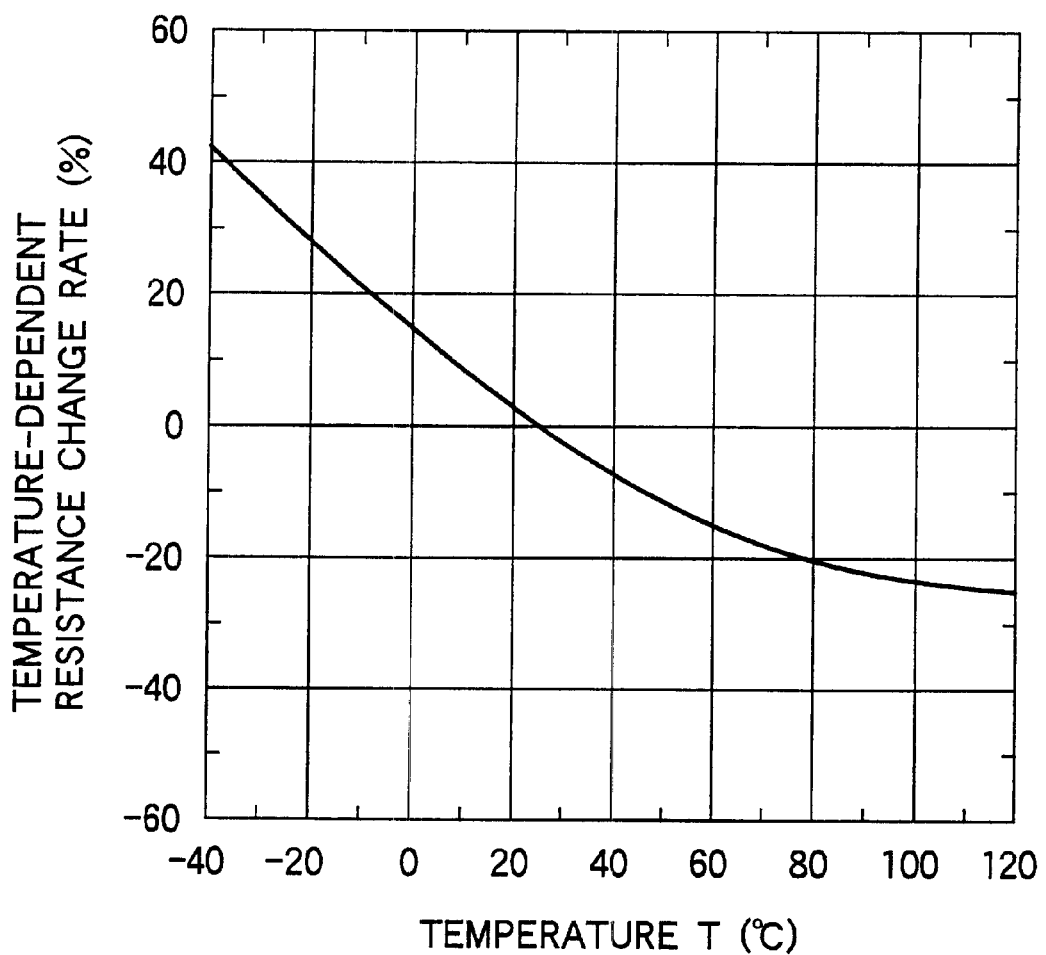
FIG. 6 is a graph showing the temperature-dependent resistance change rate of the element 5 and the element 10 in the thin-film magnetic field sensor according to the first embodiment of the present invention.

FIG. 6 shows the temperature-dependent resistance value change of the element 5. As shown in FIG. 6, the electrical resistance can be seen to linearly change relative to temperature near the room temperature.

Where the applied magnetic field is zero, the resistance value is $R_0$ at a temperature of 25° C., the absolute value of the applied magnetic field is H, and temperature is T, the electrical resistance value Ra between the electrical terminals 3 and 4 is expressed by the following formula (1).

$$Ra=R_0(1+r_M H+r_T(T-25)) \quad (1)$$

In the formula, $r_M$ denotes a coefficient of the electrical resistance value change due to the applied magnetic field, and $r_T$ denotes a temperature coefficient of the electrical resistance value.

Table 3 shows the range of the magnetic field H, in which the formula (1) and rm value relative to the length L of the soft magnetic thin-films are held.

TABLE 3

| Length (mm) | $r_M$ (1/Oe) | Magnetic Field Intensity Range Holding Linearity (Oe) |
|---|---|---|
| 0.5 | −2.94 × 10⁻² | 2.2 |
| 1.0 | −5.26 × 10⁻² | 1.2 |
| 4.0 | −1.94 × 10⁻¹ | 0.4 |

Reference symbol 6 denotes conductive films having a thickness substantially the same as that of the soft magnetic thin-films 1. The material of the conductive films is Cu. Cu has a weak anti-magnetism, but it can be considered to be magnetically almost transparent. A gap length g' is formed between the conductive films 6, and is substantially the same as the gap length g between the soft magnetic thin-films 1. The width W' of the conductive films 6 in contact with the gap is substantially the same as the width W of the soft magnetic thin-films. The length of the element 10 is arbitrary. A giant-magneto-resistant thin-film 7 is formed to fill the gap between the conductive films 6. The material of the giant-magneto-resistant thin-film 7 is the same as that of the giant-magneto-resistant thin-film 2. Electrical terminals 8 and 9 are respectively connected to the conductive films 6 on both sides separated by the gap. Reference symbol 10 denotes an element including these electrical terminals. The electrical resistance between the electrical terminals 8 and 9 is Rb.

As regards the element 10, since the conductive films 6 have no magnetic effect, the magnetic flux density applied to the giant-magneto-resistant thin-film 7 is a magnetic flux density directly induced in the giant-magneto-resistant thin-film 7 by an applied magnetic field.

Figure 7:
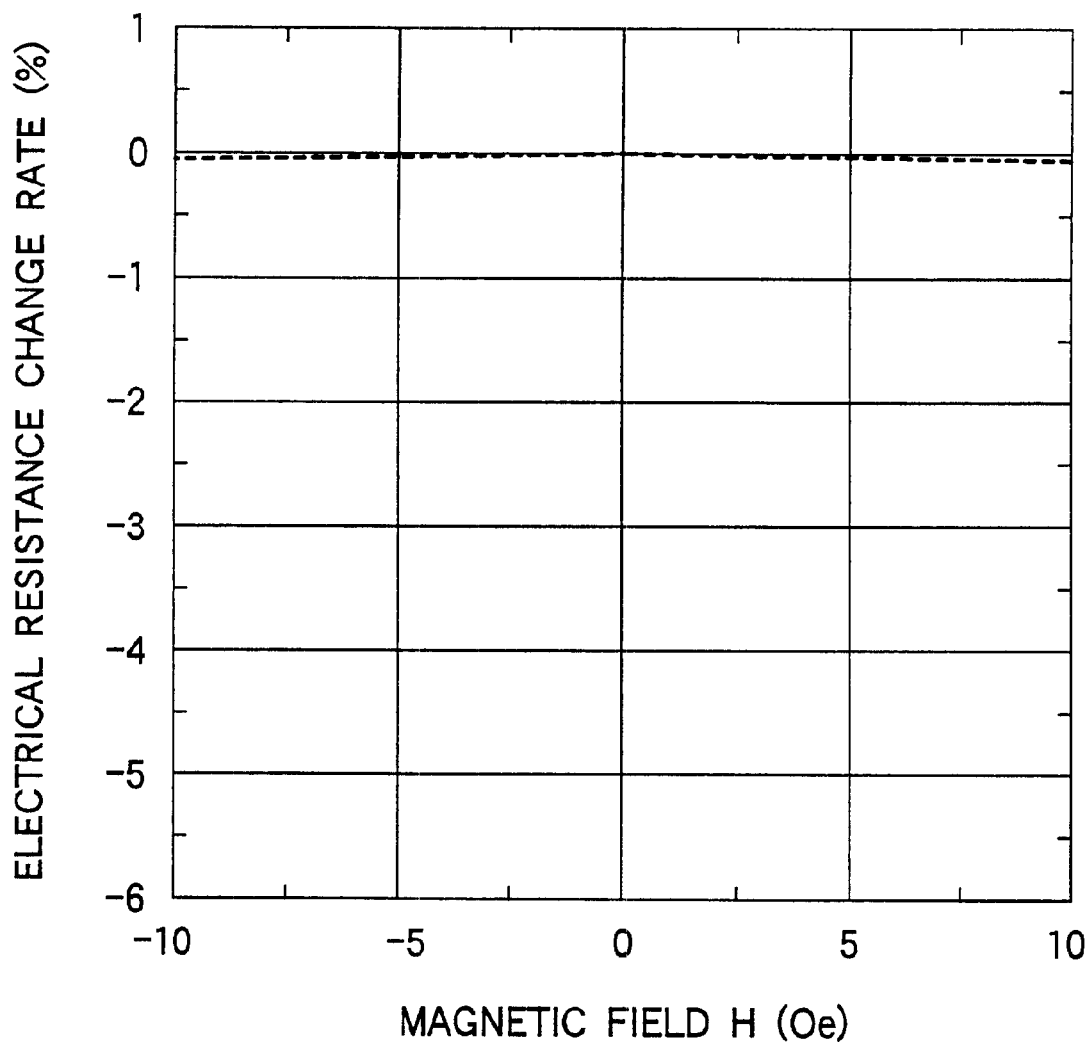
FIG. 7 is a graph showing the relationship between the electrical resistance change rate of the element 10 and the applied magnetic field in the thin-film magnetic field sensor according to the first embodiment of the present invention.

FIG. 7 shows change in the electrical resistance value of the element 10 in accordance with an applied magnetic field, where the Rb change is considered to be substantially zero. On the other hand, the electrical resistance value changes depending on temperature, as shown in FIG. 6. Accordingly, corresponding to the formula (1), the resistance value Rb of the element 10 is expressed by the following formula (2).

$$Rb=R_0(1+r_T(T-25)) \quad (2)$$

Reference symbol 11 denotes a first resistor having a resistance value Rc. Electrical terminals 12 and 13 are connected to the first resistor 11. Reference symbol 14 denotes a second resistor having a resistance value Rd. Electrical terminals 15 and 16 are connected to the second resistor 14. The first resistor and the second resistor are employed such that their resistance values and temperature coefficients precisely agree with each other. Similarly to the formulas (1) and (2), where the temperature coefficient of resistance is $r_T'$, the following formulas (3) and (4) are obtained.

$$Rc=R_0(1+r_T'(T-25)) \quad (3)$$

$$Rd=R_0(1+r_T'(T-25)) \quad (4)$$

Figure 8:
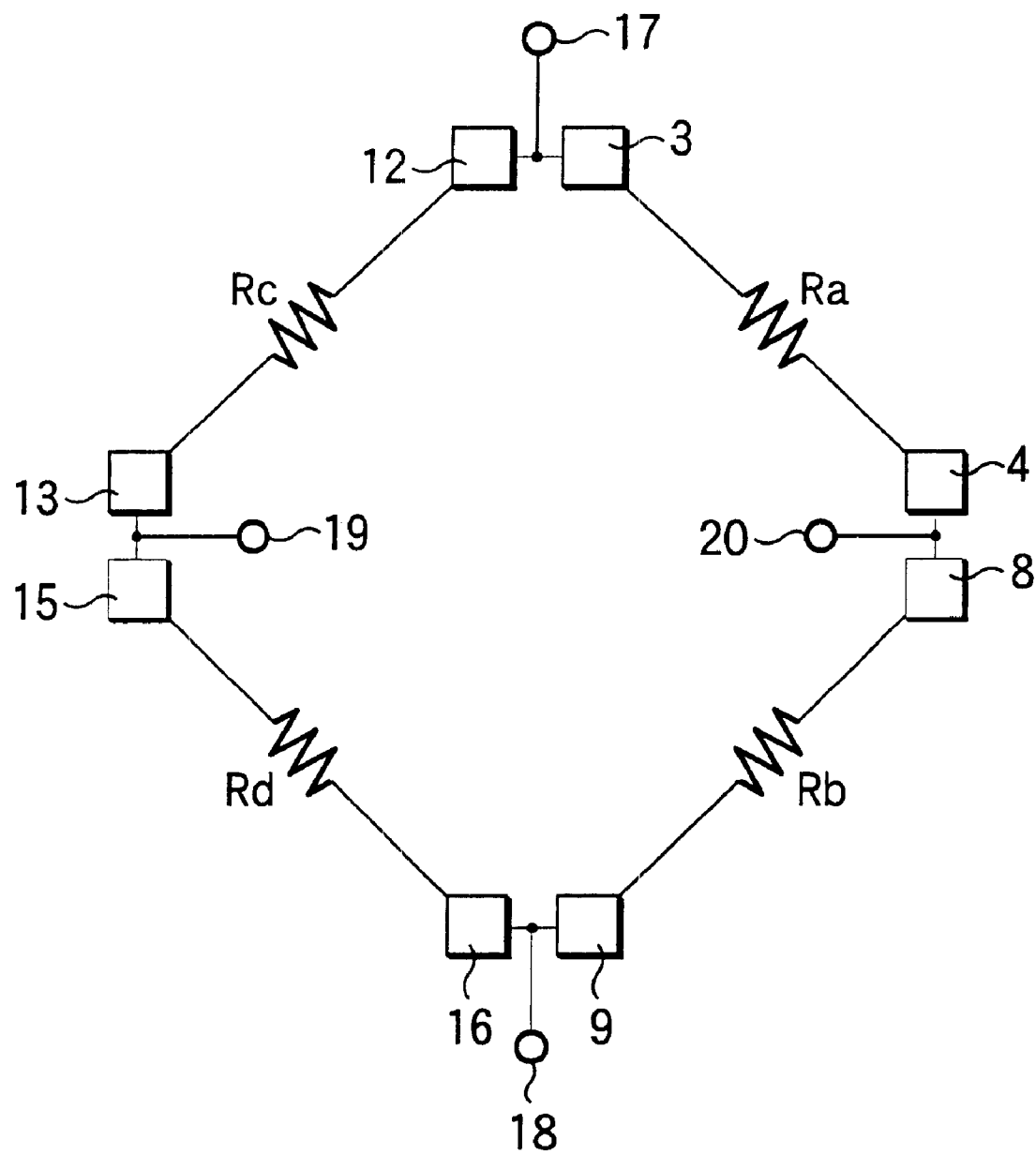
FIG. 8 is an electrically equivalent circuit diagram showing the thin-film magnetic field sensor according to the first embodiment of the present invention.

In each of the groups of terminals 4, 8, and 20, terminals 3, 12, and 17, terminals 9, 16, and 18, and terminals 13, 15, and 19, the terminals are electrically connected to each other. FIG. 8 shows the structure shown in FIG. 4 as an electrically equivalent circuit, which forms one bridge circuit as a whole. The elements 5 and 10 form two arms of the bridge circuit. A driving voltage is applied between the terminals 17 and 18, while the output voltage of the bridge appears between the output terminals 19 and 20.

In the circuit shown in FIG. 8, when a voltage of $V_0$ is applied between the terminals 17 and 18, a voltage $V_2$ appears between the terminals 19 and 20, and is expressed by the following formula (5).

$$V_2=(RaRd-RbRc)V_0/((Ra+Rb)\times(Rc+Rd)) \quad (5)$$

Where the formulas (1), (2), (3), and (4) are substituted into Ra, Rb, Rc, and Rd of formula (5), and a secondary small amount is omitted, all the terms of $V_2$ relating to temperature are canceled, and the following formula (6) is obtained.

$$V_2=r_T HV_0/4 \quad (6)$$

In the formula, $V_0$ and $r_T$ are constants determined in advance, and thus, if a measurement value of $V_2$ is obtained, an objective magnetic field H is determined as shown in the following formula (7).

$$H = 4V_2/(V_0 r_T) \quad (7)$$

A level relative to $V_0$, at which the bridge output $V_2$ allows a stable detection, is determined by stability of an amplifier for the bridge circuit output voltage, or the like. In general, however, $V_2/V_0 = 1 \times 10^{-5}$ can be easily realized. Accordingly, where $V_2/V_0 = 1 \times 10^{-5}$ and the $r_T$ value of the giant-magneto-resistant thin-film 2 are substituted into the formula (7), the magnetic field resolution available according to the present invention is obtained. The result of this is shown in Table 4.

TABLE 4

Figure 9:
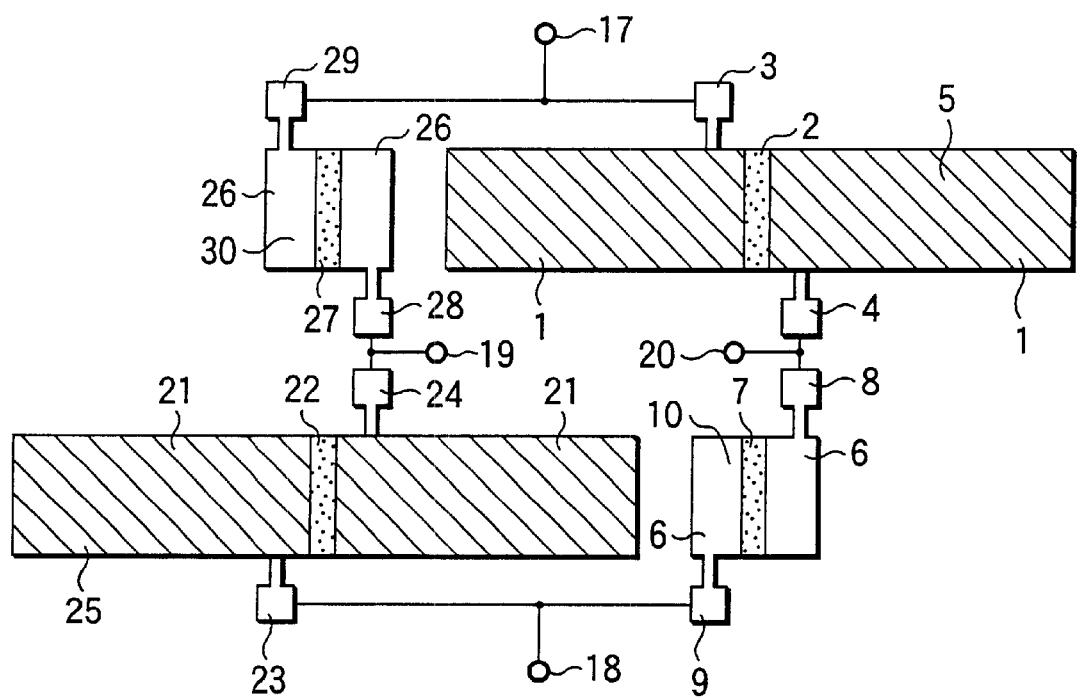
FIG. 9 is a circuit diagram showing a thin-film magnetic field sensor according to a second embodiment of the present invention, where a bridge circuit is constructed by four arms, i.e., elements 5 and 25 each formed by sandwiching a giant-magneto-resistant thin-film between soft magnetic thin-films, and elements 10 and 30 each formed by sandwiching a giant-magneto-resistant thin-film between conductive films.

| Length (mm) | Magnetic Field Detection Accuracy (mOe) | |
|---|---|---|
| | Structure shown in FIG. 4 | Structure shown in FIG. 9 |
| 0.5 | 1.4 | 0.7 |
| 1.0 | 0.8 | 0.4 |
| 4.0 | 0.2 | 0.1 |

The resolution shown in Table 4 is comparable to the resolution by conventional FluxGaTe sensors. The FluxGaTe sensors utilize a saturation characteristic of a magnetic material, and are complicated and balky as a sensor structure. The structure according to the present invention is very simple, compact, and lightweight, as compared to these magnetic field sensors.

Second Embodiment

FIG. 9 shows a second embodiment of the present invention. In FIG. 9, an element 25 is the same as the element 5 shown in FIG. 4, and an element 30 is the same as the element 10 shown in FIG. 4. As a whole circuit, the element 25 is disposed in place of the first resistor 11, and the element 30 is disposed in place of the second resistor 14. Where FIG. 9 is expressed by an equivalent circuit, it becomes the same as the circuit shown in FIG. 8, as a whole. However, in the case of FIG. 9, Rd=Ra, and Rc=Rb are held. Accordingly, where the formulas (1) and (2) are substituted into the formula (5), the following formula (8) is obtained.

$$V_2 = r_T H V_0 / 2 \quad (8)$$

The value of the formula (8) becomes twice that of the formula (6). Accordingly, with the structure shown in FIG. 9, it is possible to estimate the degree of a magnetic field more accurately than the structure shown in FIG. 4, and the detectable magnetic field resolution is improved to be half.

Third Embodiment

Figure 10:
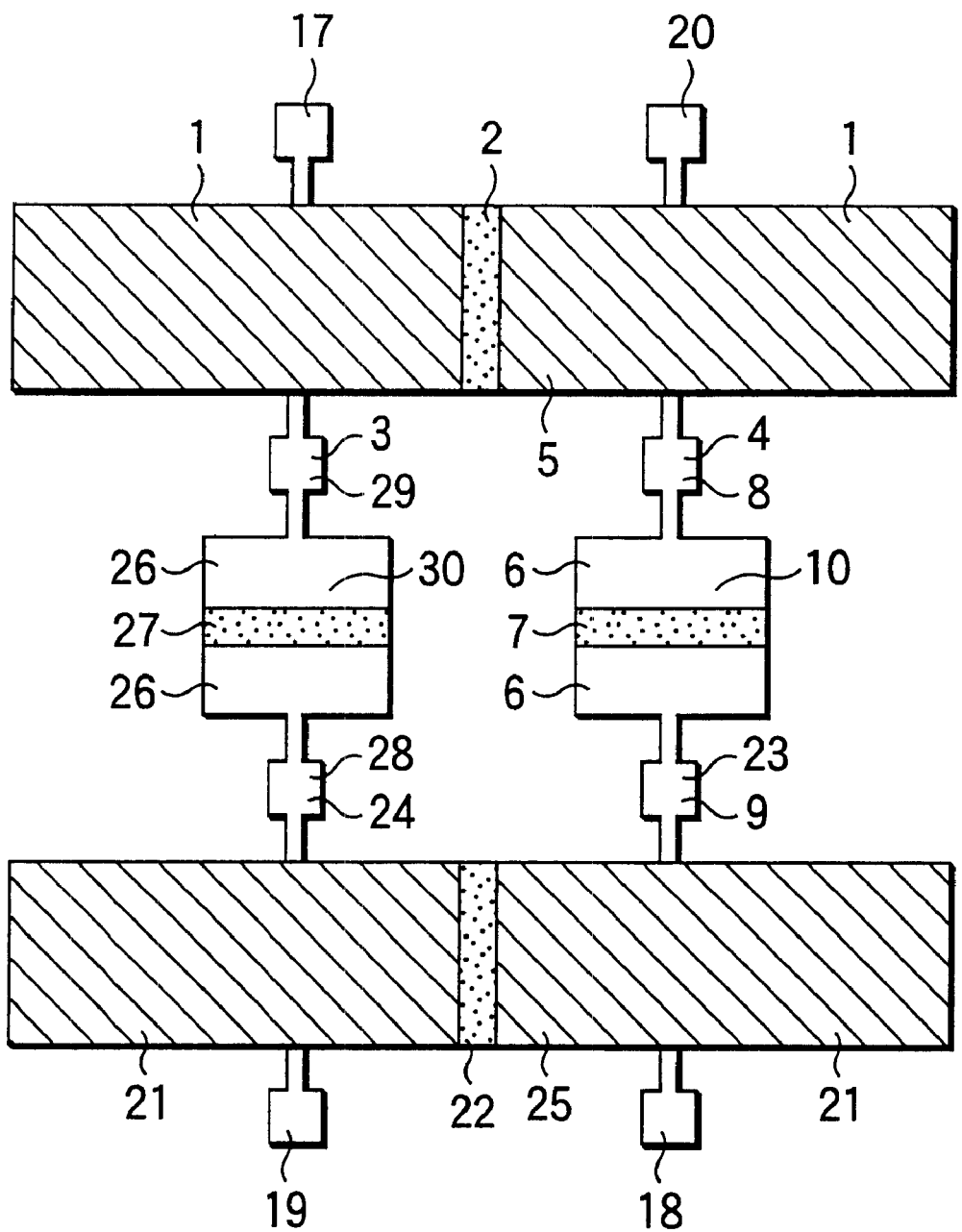
FIG. 10 is a circuit diagram showing a thin-film magnetic field sensor according to a third embodiment of the present invention.

FIG. 10 shows a third embodiment of the present invention. In FIG. 10, an element 5 and an element 25 are disposed in parallel, and an element 10 and an element 30 are disposed between them, so that it is possible to provide an effective use of the occupation area, as a whole. Each pair of terminals 4 and 8, terminals 24 and 28, terminals 3 and 29, and terminals 23 and 9 share a common part, so that the connections between these terminals are omitted to simplify the structure. Terminals 17, 18, 19, and 20 to be connected to external circuits are not directly connected to the corresponding terminals 3, 9, 23, 29, 4, 8, 24, and 28, but electrically connected to them through the elements 5 and 25, so that it has the same function as FIG. 8. As regards the angles between giant-magneto-resistant thin-films in the arrangement shown in FIG. 10, the element 5 is disposed perpendicular to the element 10, and the element 25 is disposed perpendicular to the element 30. The elements 10 and 30 have a sensitivity of almost zero to the magnetic field, as shown in FIG. 7. However, where the arrangement shown in FIG. 10 is adopted, the electrical resistance change of the elements 10 and 30 becomes precisely zero relative to a magnetic field applied in the longitudinal direction of the elements 5 and 25.

Fourth Embodiment

Figure 11:
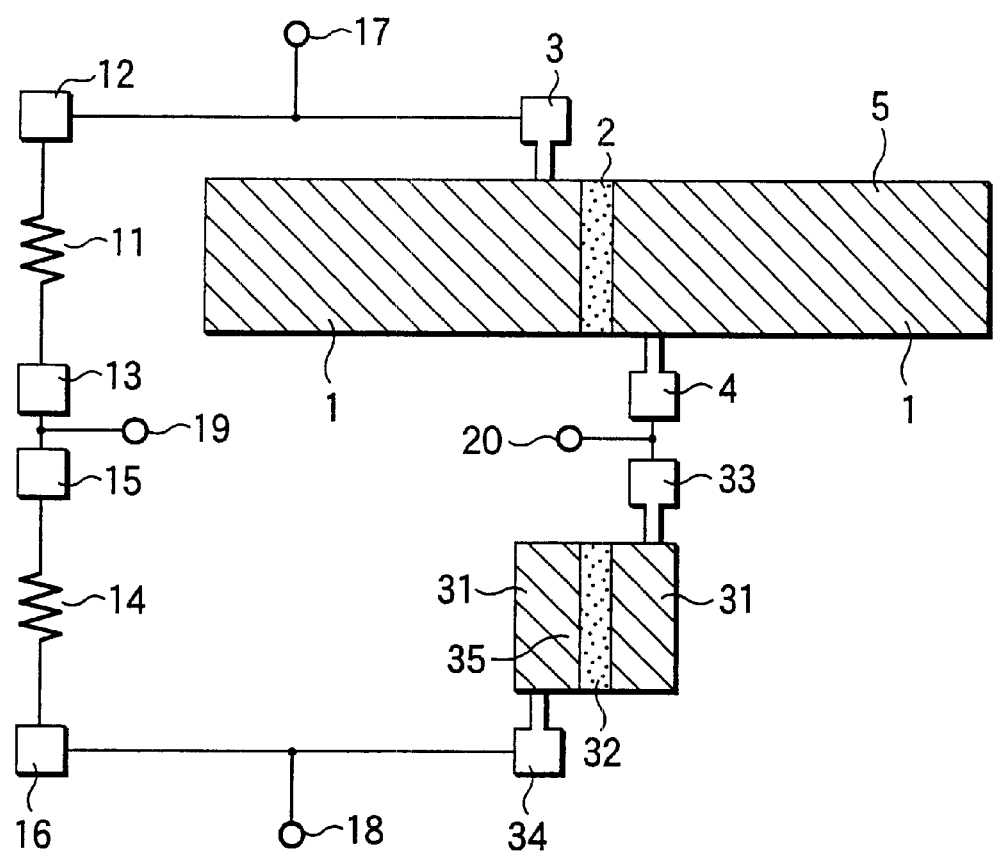
FIG. 11 is a circuit diagram showing a thin-film magnetic field sensor according to a fourth embodiment of the present invention.

FIG. 11 shows a fourth embodiment of the present invention. In the fourth embodiment, a material common to soft magnetic thin-films 1 is used for the conductive films 6 of the first embodiment shown in FIG. 4. In the first embodiment, it is necessary to equalize those parts of the electrical resistance change of the elements 5 and 10 other than those due to a magnetic field to cancel them in the bridge circuit. For this reason, the giant-magneto-resistant thin-films need to have commonality in the material and structure. Even where the giant-magneto-resistant thin-films themselves are the same, a small difference may be brought about in the electrical resistance, depending on materials in contact with them. This is caused by contact potential difference, thermally electromotive force, or the like. In the fourth embodiment, a soft magnetic thin-film common to elements 5 and 35 is used as a material in contact with giant-magneto-resistant thin-films, so that this problem is prevented. However, where the size of soft magnetic thin-films 31 is large in the element 35, the magnetic flux density applied to a giant-magneto-resistant thin-film 32 inevitably becomes large, thereby lowering the sensitivity of the magnetic field sensor, which is the resistance value difference between the elements 5 and 35. In the fourth embodiment, the surface area of the soft magnetic thin-films 31 in the element 35 is set to be ¹⁄₁₀ or less that of the soft magnetic thin-films 1 in the element 5, so that this problem is prevented. With this arrangement, it is possible to ensure an output voltage at least 90% of a bridge output voltage obtained where the conductive portions of the element 35 are made of a non-magnetic material, and thus to realize a thin-film magnetic field sensor with a high accuracy.

Fifth Embodiment

Figure 12:
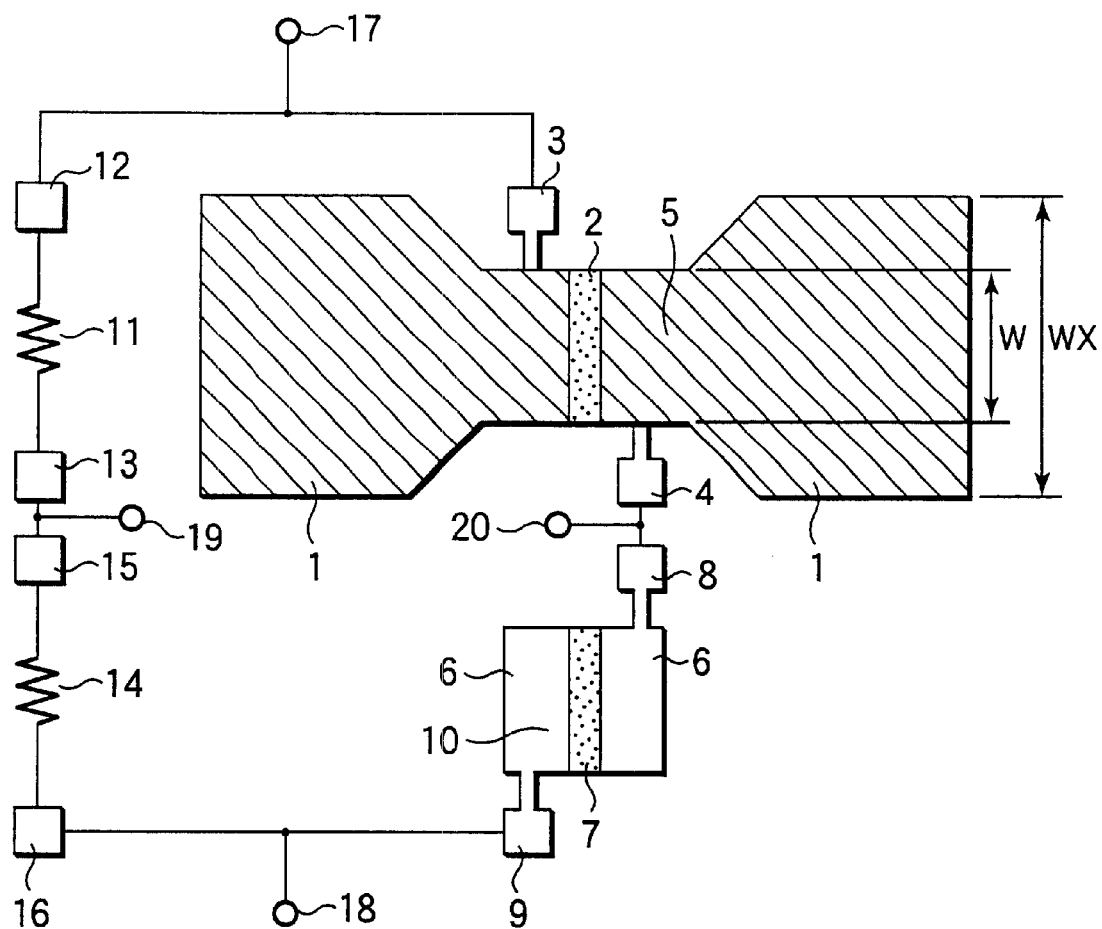
FIG. 12 is a circuit diagram showing a thin-film magnetic field sensor according to a fifth embodiment of the present invention.

FIG. 12 shows a fifth embodiment of the present invention. In the first embodiment, the magnetic field sensitivity of the element 5 is increased by an increase in the length L of the soft magnetic thin-films. The soft magnetic thin-films 1 function as members for gathering magnetic flux around them, and concentrating them onto the giant-magneto-resistant thin-film portion. This function is almost in proportion to the area of the soft magnetic thin-films.

Accordingly, in the structure shown in FIG. 4, where a sensitivity relative to a smaller magnetic field is provided, the length L has to be increased, so the entire size of the magnetic field sensor is inevitably becomes larger. Accordingly, as shown in FIG. 12, there are employed soft magnetic thin-films each arranged to have a change in the width such that it has a portion with a width WX larger than the width W of the soft magnetic thin-films in contact with a giant-magneto-resistant thin-film. With this arrangement, it is possible to provide an effective use of the occupation area of the soft magnetic thin-films, and to realize a magnetic field sensor, which is compact as a whole and has a high magnetic field sensitivity.

Sixth Embodiment

Figure 13:
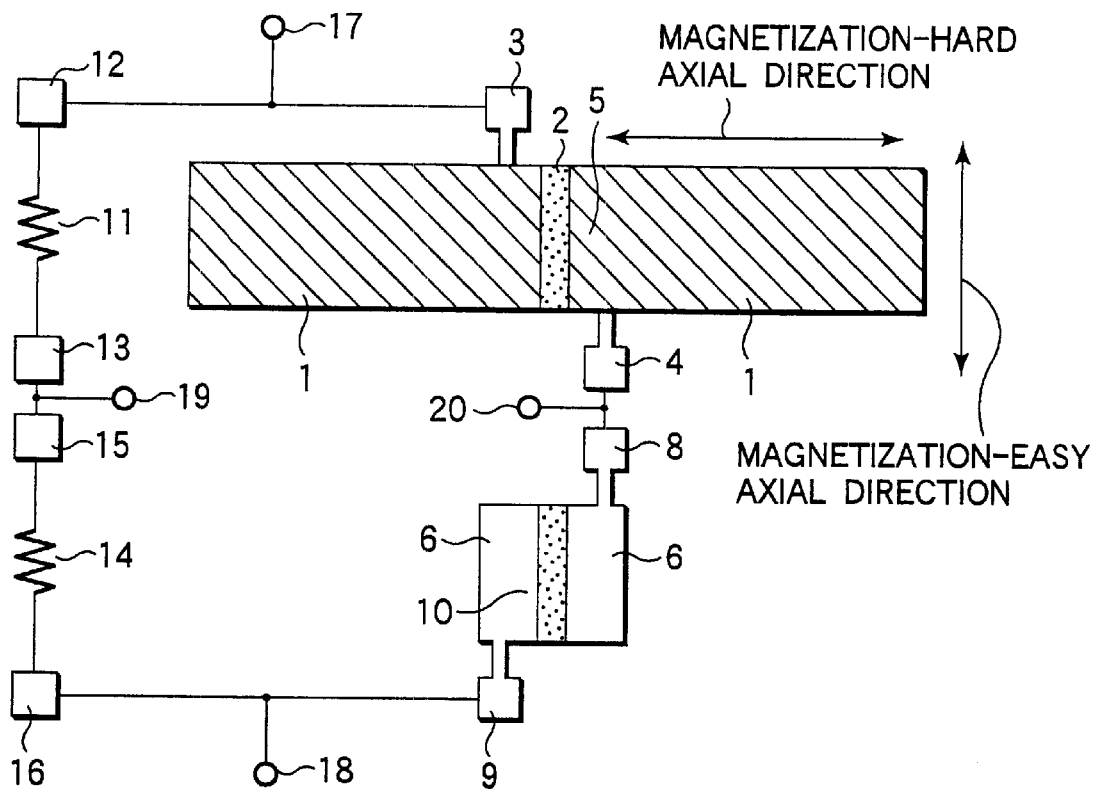
FIG. 13 is a circuit diagram showing a thin-film magnetic field sensor according to a sixth embodiment of the present invention.

FIG. 13 shows a sixth embodiment of the present invention. After an external magnetic field is applied and then removed, soft magnetic thin-films hardly allow magnetization to stay, but some magnetization may still stay in the range of coercive force Hc. Since residual magnetization can be a direct error in the detected magnetic field, it is preferably to use a material, which makes residual magnetization as little as possible. As shown in Table 1, $Co_{77}Fe_6Si_9B_8$ has a low Hc value about ⅙ that of Permalloy. Although the low Hc value appears in both the directions of magnetization-hard and magnetization-easy axes, it becomes particularly prominent in the direction of the magnetization-hard axis. In general, since a magnetic material having uniaxial anisotropy takes a magnetization process by magnetization rotation in the hard axial direction, hardly any hysteresis occurs, whereby Hc becomes almost zero. Accordingly, residual magnetization in the hard axial direction is very small. In the sixth embodiment, the hard axial direction of a material having uniaxial anisotropy is set to be a magnetic field detection direction, and thus residual magnetization in the soft magnetic thin-films is small after an external magnetic field is applied and then removed. As a result, it is possible to accurately measure a magnetic field.

According to the first to sixth embodiments described above, the following effects can be obtained.

Those parts of the electrical resistance value changes of a giant-magneto-resistance effect thin-film, e.g., due to temperature, other than that due to an applied magnetic field are all canceled in a bridge circuit and not included in the bridge output. Consequently, since those parts of the electrical resistance value changes of a giant-magneto-resistance effect thin-films, e.g., due to temperature, which is a problem in conventional techniques, are excluded, it is possible to detect a genuine change due to a applied magnetic field.

Since a function of a bridge circuit to detect a very small electrical resistance value change can be utilized, it is possible to detect a magnetic field with a high resolution corresponding to a very small change.

In order to avoid a very small difference in the resistance value due to a difference between materials of two members disposed one on either side of a giant-magneto-resistant thin-film, the two members on the both sides of the giant-magneto-resistant thin-film can be made of the same material. In this case, it is possible to precisely cancel those parts of the electrical resistance value changes other than those due to a magnetic field.

Where soft magnetic thin-films disposed one on either side of a giant-magneto-resistant thin-film are formed to have a reduced length and instead an increased width, it is possible to form a compact magnetic field sensor without lowering the sensitivity of the magnetic field sensor.

Where soft magnetic thin-films disposed one on either side of a giant-magneto-resistant thin-film are made of a material having uniaxial anisotropy to allow only a small residual magnetization, it is possible to prevent magnetic field detection accuracy from lowering due to residual magnetization after a detected magnetic field is removed.

Seventh Embodiment

Figure 14:
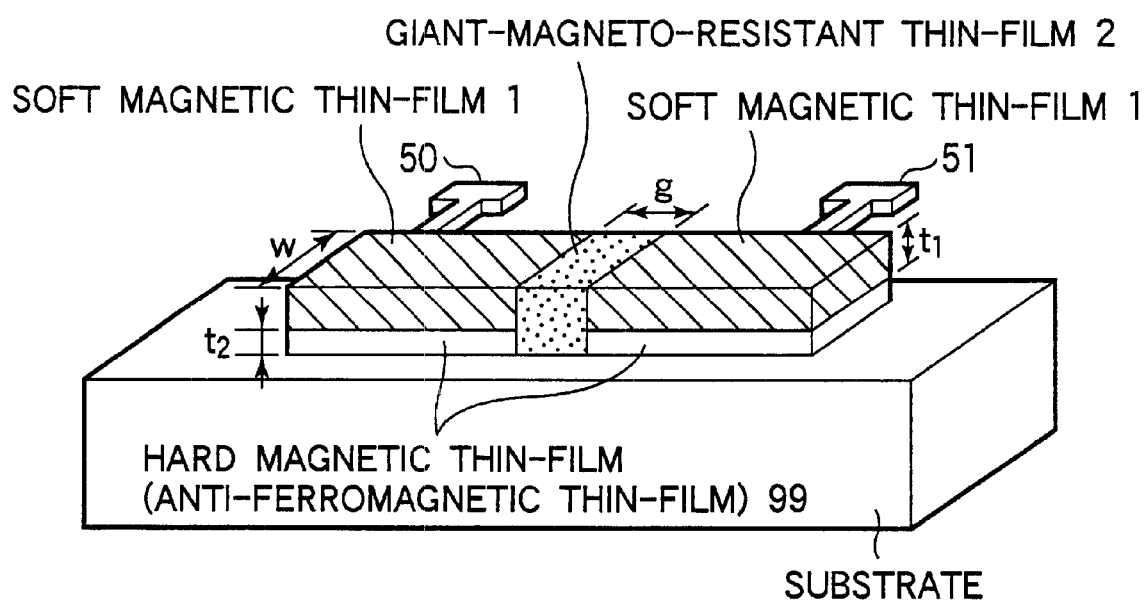
FIG. 14 is an oblique view showing a thin-film magnetic field sensor according to a seventh embodiment of the present invention, which includes a magnetic field generation source.

FIG. 14 is an oblique view showing a thin-film magnetic field sensor according to the present invention, which includes a magnetic field generator. In FIGS. 14 to 19, the part corresponding to a soft magnetic thin-film is shown with diagonal lines, the part corresponding to a giant-magneto-resistant thin-film is shown with dots, and the part corresponding to a hard magnetic film or an anti-ferromagnetic film is shown with a blank.

A hard magnetic film having a large coercive force is a magnetic thin-film having magnetic properties different from those of a soft magnetic film having a small coercive force. In this embodiment, soft magnetic thin-films, a giant-magneto-resistant thin-film, and hard magnetic thin-films (or anti-ferromagnetic thin-films) are manufactured by a sputtering method in an Ar gas atmosphere, and then they are subjected to a heat treatment at 200° C. for two hours.

The thickness t, of the soft magnetic thin-films is 1 μm. The soft magnetic thin-films is provided with a gap therebetween, indicated with a gap length g. The gap length g is 1 μm. The width W of the soft magnetic thin-films in contact with the gap is 100 μm. The soft magnetic thin-films are formed of Permalloy, which has a high saturation magnetic flux density of 15 kG or more, and a low coercive force of 0.5 Oe or less. Typical materials, including the material describe above and other materials, for the soft magnetic thin-films and their properties are shown in Table 5. The soft magnetic thin-films preferably have a coercive force of 5 Oe or less, and a saturation magnetic flux density of 3 kG or more.

TABLE 5

| Material Name | Coercive Force (Oe) | Saturation Magnetic Flux Density (kG) |
| --- | --- | --- |
| Permalloy ® ($Fe_{66}Ni_{34}$) | 0.4 | 17 |
| Amorphous Alloy ($CO_{77}Fe_6Si_9B_8$) | 0.07 | 12 |
| Sendust ® ($Fe_{74}Si_9Al_{17}$) | 0.02 | 10 |
| Hardperm ® ($Fe_{12}Ni_{82}Nb_6$) | 0.03 | 8 |
| Nano-Granular Alloy ($Co_{70}Al_{10}O_{20}$) | 0.1 | 10 |
| Finemet ® ($Fe_{76}Si_{13}B_8Nb_2Cu_1$) | 0.1 | 14 |
| Nanomax ® ($Fe_{83}Hf_6C_{11}$) | 0.1 | 17 |

The giant-magneto-resistant thin-film is an alloy thin-film of $Co_{39}Y_{14}O_{47}$ formed to fill the gap between the soft magnetic thin-films. The giant-magneto-resistant thin-film is preferably made of a material having a high rate of electrical resistance change caused by a magnetic field. Typical materials, including the material describe above and other materials, usable for the giant-magneto-resistant thin-film and their properties are shown in Table 2.

Hard magnetic thin-films 99 are respectively formed below the soft magnetic thin-films 1. The hard magnetic thin-films 99 are each formed of an $Fe_{50}Pt_{50}$ alloy thin-film having a large coercive force, and have a thickness t2 of 0.1 μm. The hard magnetic thin-films 99 are magnetically coupled with the soft magnetic thin-films 1 having a small coercive force, and have a function to apply a bias magnetic field to the soft magnetic thin-films 1. The hard magnetic thin-films 99 have an arbitrary uniaxial anisotropy magnetic field and a large coercive force. Where the thickness and magnetic properties of the hard magnetic thin-films 99 are changed, a bias magnetic field with an arbitrary degree can be applied to the soft magnetic thin-films 1. In this embodiment, the hard magnetic thin-films 99 are disposed below the soft magnetic thin-films 1, but they may be disposed on top of the soft magnetic thin-films 1, or disposed between upper and lower soft magnetic thin-films 1. Furthermore, a plurality of soft magnetic thin-films 1 and a plurality of hard magnetic thin-films 99 may be alternately stacked one on the other.

The material of the hard magnetic thin-films 99 may be replaced with anti-ferromagnetic thin-films or bulks of anti-ferromagnetic material members. Typical materials, including the Fe—Pt alloy thin-film, for the hard magnetic thin-films 99 are shown in Table 6.

The electrical resistance change is detected by electrical terminals 50 and 51, which are shown as examples.

TABLE 6

| Material Name | Coercive Force (kOe) | Maximum Energy Product (MGOe) |
|---|---|---|
| $Fe_{50}Pt_{50}$ | 1.6 | 20.0 |
| $Co_{50}Pt_{50}$ | 2.6 | 10.0 |
| Alnico ($Al_{12}Ni_{22}Co_5Fe_{61}$) | 0.6 | 5.0 |
| Ba - Ferrite | 1.9 | 1.0 |
| Sr - Ferrite | 2.8 | 3.0 |
| $SmCo_5$ | 9.0 | 20.0 |
| $Nd_{15}Fe_{77}B_8$ | 12.4 | 35.0 |
| $Ni_{25}Mn_{75}$ (Anti-Freeomagnetic Body) | — | — |

Figure 15:
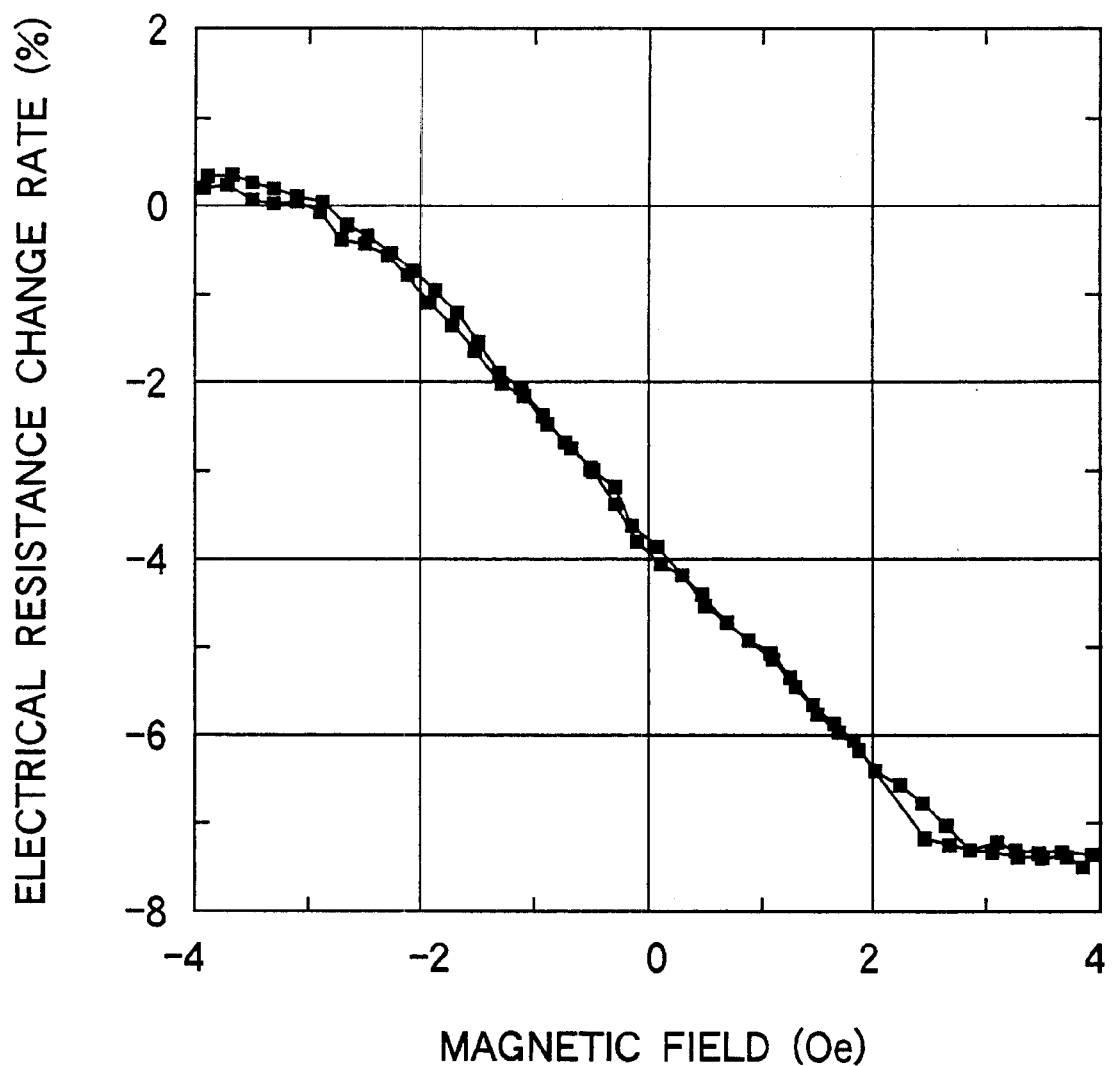
FIG. 15 is a graph showing the relationship between the electrical resistance change rate and the external magnetic field in the thin-film magnetic field sensor according to the seventh embodiment.

FIG. 15 is a graph showing the relationship between the electrical resistance change rate and the external magnetic field in the thin-film magnetic field sensor according to the seventh embodiment. In this example, a bias magnetic field of about −3.5 kOe is applied. The electrical resistance changes asymmetrically relative to the positive and negative changes of the external magnetic field, and thus the positive and negative directions of the external magnetic field can be determined.

Eighth Embodiment

Figure 16:
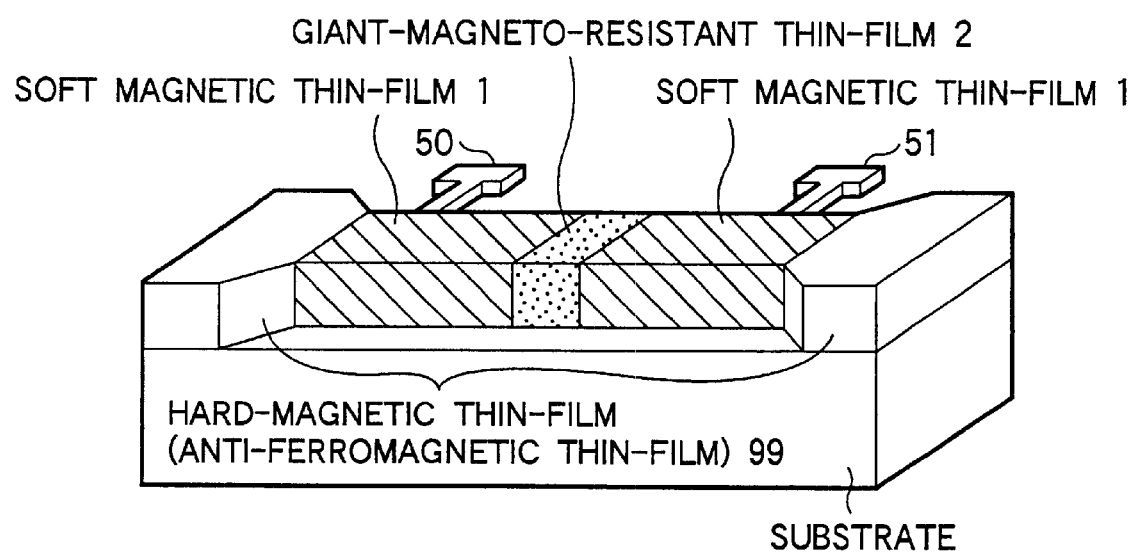
FIG. 16 is an oblique view showing a thin-film magnetic field sensor according to the present invention, which includes a magnetic field generator outside a magnetic field sensor element.

FIG. 16 is an oblique view showing a thin-film magnetic field sensor according to the present invention, which includes a magnetic field generator outside a magnetic field sensor element. In FIG. 16, hard magnetic thin-films 99 are each formed of a hard magnetic thin-film having a large coercive force, so that a bias magnetic field can be applied. Soft magnetic thin-films 1, a giant-magneto-resistant thin-film 2, and the hard magnetic thin-films 99 are manufactured by the same method as the seventh embodiment. The materials of the soft magnetic thin-films 1 and the giant-magneto-resistant thin-film 2, the gap length g, the width W, and the thickness t, of the soft magnetic thin-films 1 are the same as those of the seventh embodiment. The hard magnetic thin-films 99 are each formed of an $Fe_{50}Pt_{50}$ alloy thin-film having a thickness of 1 μm, and have a function to apply a bias magnetic field to the soft magnetic thin-films 1 having a small coercive force. The hard magnetic thin-films 99 have an arbitrary uniaxial anisotropy magnetic field and coercive force. Where the thickness and magnetic properties of the hard magnetic thin-films 99 are changed, an arbitrary bias magnetic field can be applied to the soft magnetic thin-films 1. A hard magnetic thin-film or an anti-ferromagnetic thin-film, as shown in Table 6 can be used as the hard magnetic thin-films 99.

The electrical resistance change is detected by electrical terminals 50 and 51, which are shown as examples.

Figure 17:
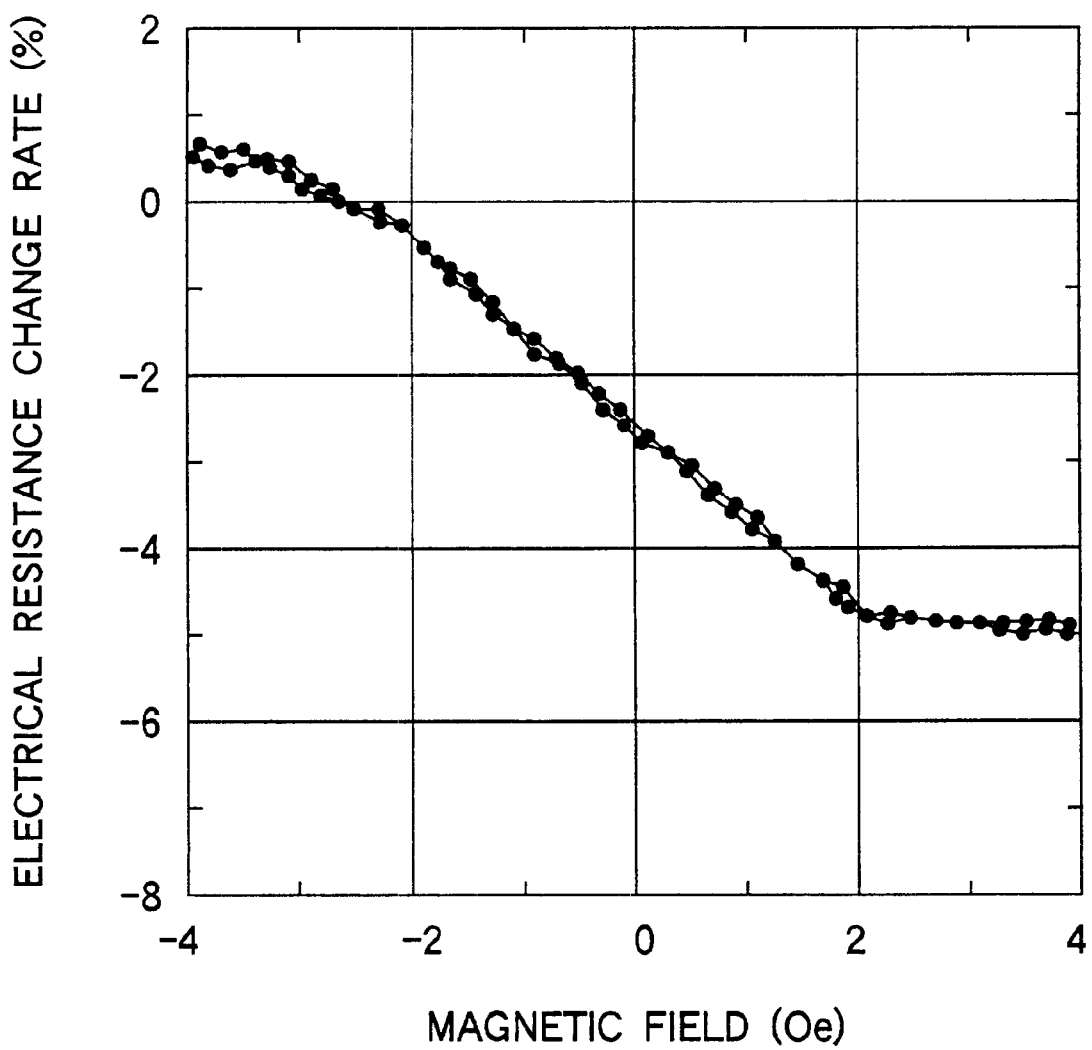
FIG. 17 is a graph showing the relationship between the electrical resistance change rate and the external magnetic field in the thin-film magnetic field sensor according to an eighth embodiment.

FIG. 17 is a graph showing the relationship between the electrical resistance change rate and the external magnetic field in the thin-film magnetic field sensor according to the eighth embodiment. In this example, a bias magnetic field of about −3.5 Oe is applied. The electrical resistance changes asymmetrically relative to the positive and negative changes of the external magnetic field, and thus the positive and negative directions of the external magnetic field can be determined.

In this embodiment, the pair of hard magnetic thin-films or bulks of hard magnetic material members are disposed in parallel to the gap to sandwich the soft magnetic thin-films and the giant-magneto-resistant thin-film, but they may be disposed perpendicular to the gap. Furthermore, one or both of the pair of hard magnetic thin-films or bulks of hard magnetic material members may be disposed in contact with or out of contact with the soft magnetic thin-films. As described above, the positions or shapes of the hard magnetic thin-films or bulks of hard magnetic material members can be changed to arbitrarily control the degree of the bias magnetic field.

Ninth Embodiment

Figure 18:
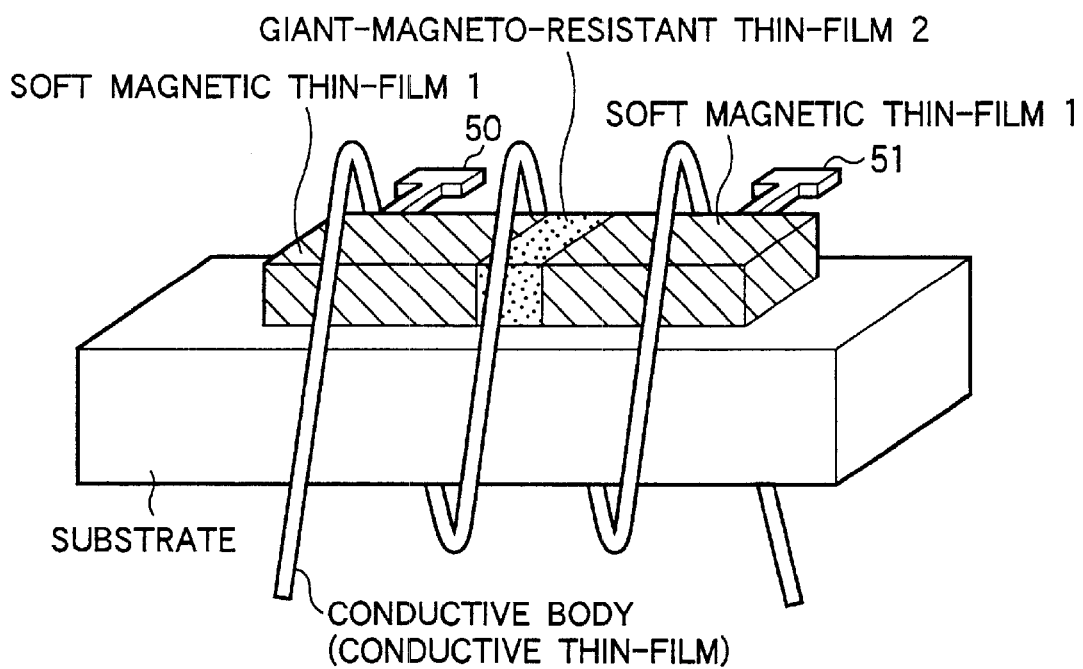
FIG. 18 is an oblique view showing a thin-film magnetic field sensor according to a ninth embodiment, which includes a coil.

FIG. 18 is an oblique view showing a thin-film magnetic field sensor according to the present invention, which includes a coil. In FIG. 18, soft magnetic thin-films and a giant-magneto-resistant thin-film are manufactured by the same method as the seventh embodiment. The materials of the soft magnetic thin-films and the giant-magneto-resistant thin-film, the gap length g, the width W, and the thickness t, of the soft magnetic thin-films are the same as those of the seventh embodiment. A conductive body is disposed to form a coil having a diameter of 20 μm and 20 turns. An arbitrary current is caused to flow through the coil of the conductive body, so that a bias magnetic field is applied to a magnetic field sensor element formed of the soft magnetic thin-films and the giant-magneto-resistant thin-film. The number of turns is adjusted as the need arises, to adjust the bias magnetic field.

The electrical resistance change is detected by electrical terminals 50 and 51, which are shown as examples.

Figure 19:
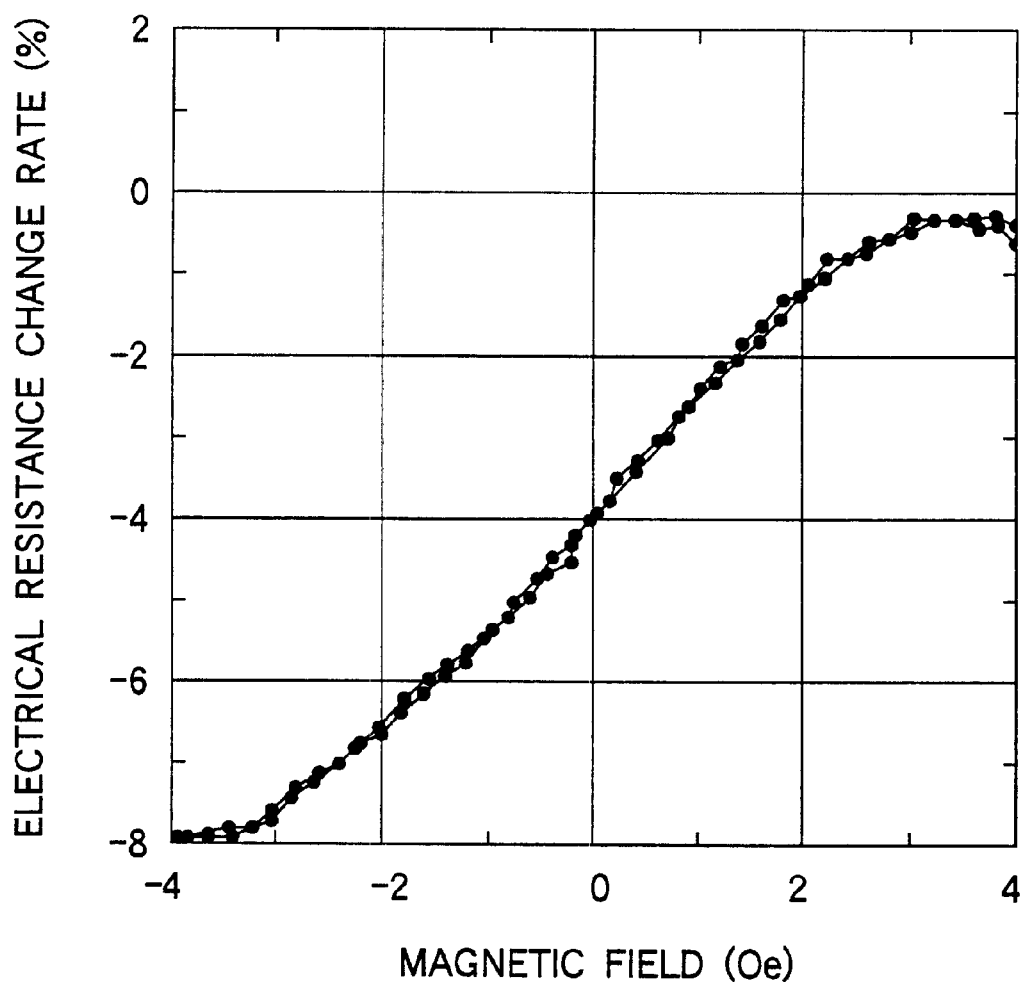
FIG. 19 is a graph showing the relationship between the electrical resistance change rate and the external magnetic field in the thin-film magnetic field sensor according to the ninth embodiment.

FIG. 19 is a graph showing the relationship between the electrical resistance change rate and the external magnetic field in the thin-film magnetic field sensor according to the ninth embodiment. In this example, a bias magnetic field of about +3.5 Oe is applied. The electrical resistance changes asymmetrically relative to the positive and negative changes of the external magnetic field, and thus the positive and negative directions of the external magnetic field can be determined.

In this embodiment, the conductive body forms a coil, but a linear or curved conductive body may be disposed in contact with or near the magnetic field sensor element, so that a bias magnetic field is applied to the magnetic field sensor element. The conductive body is not limited to a wire, but may be a conductive thin-film formed by a sputtering method or a vacuum vapor deposition method.

According to the seventh to ninth embodiments described above, the following effects can be obtained.

Where a predetermined bias magnetic field is applied to a magnetic field sensor element, the degree and polarity of a magnetic field can be detected together. A thin-film magnetic field sensor according to the present invention can be used as an azimuth sensor or an angle sensor, which needs to specify the direction of a magnetic field, and can further improve the performance of the sensor.

Tenth Embodiment

Figure 20:
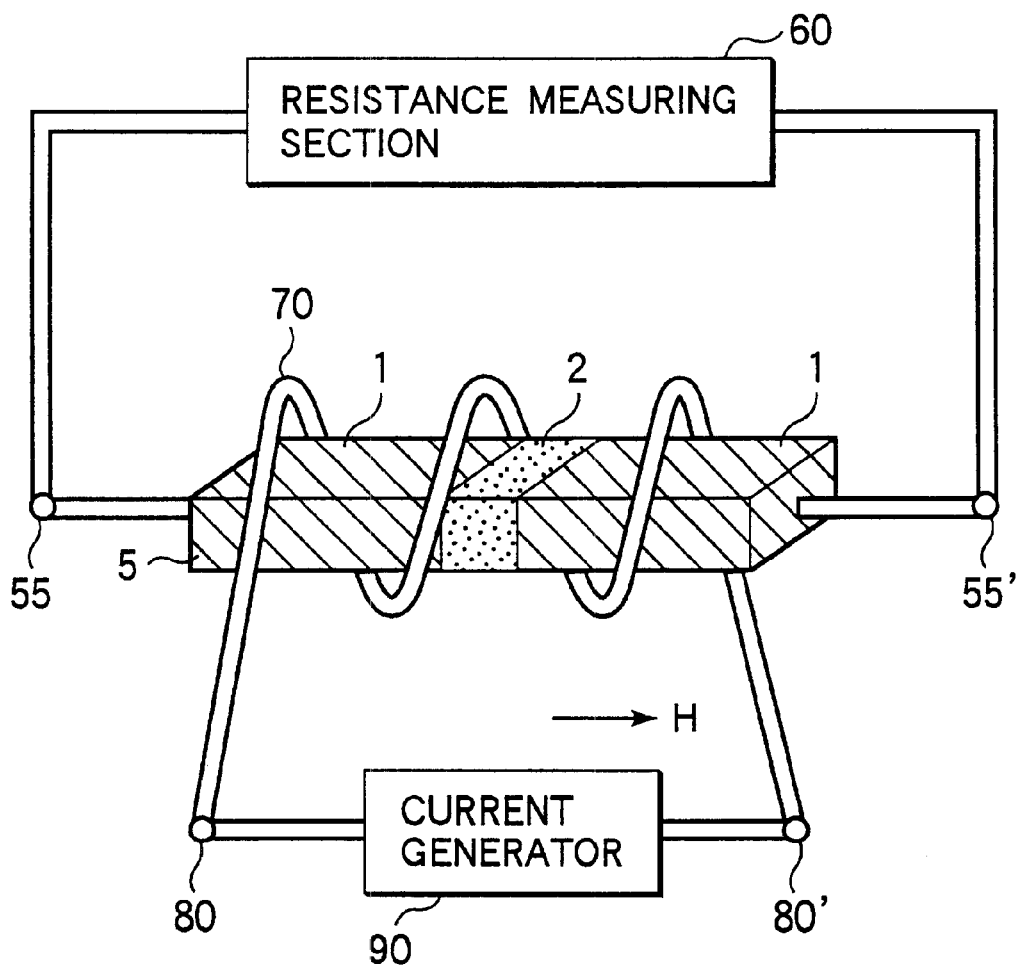
FIG. 20 is an oblique view showing a thin-film magnetic field sensor according to a tenth embodiment, which includes a coil wound around soft magnetic thin-films and a giant-magneto-resistant thin-film.

FIG. 20 is an oblique view showing a thin-film magnetic field sensor according to a tenth embodiment, which includes a coil wound around soft magnetic thin-films and a giant-magneto-resistant thin-film.

Reference symbol 1 denotes soft magnetic thin-films having a composition of, e.g., $Co_{77}Fe_6Si_9B_8$. This material is characterized by having a very large saturation magnetic flux density of 12 kG, and a very small coercive force of 0.07 Oe. The soft magnetic thin-films form a narrow slit therebetween, and a giant-magneto-resistant thin-film 2 having a composition of, e.g., $Co_{39}Y_{14}O_{47}$ is formed to fill the slit. A section formed of the soft magnetic thin-films 1 and the giant-magneto-resistant thin-film 2 is named a sensor-basic element 5. The resistance value between terminals 55 and 55' connected to the soft magnetic thin-films 1 is substantially equal to the resistance value of the giant-magneto-resistant thin-film 2, because the soft magnetic thin-films 1 has a low resistivity, which is 1/100 or less that of the giant-magneto-resistant thin-film 2. Reference symbol 60 denotes a measuring section for the resistance value, in which it is measured by measuring a generation voltage between the terminals when a constant current is caused to flow.

A coil 70 is wound around the sensor-basic element 5. The opposite ends of the coil 70 are connected to terminals 80 and 80'. Reference symbol 90 denotes a current generator (constant current source) for causing a predetermined current to flow.

Eleventh Embodiment

Figure 21:
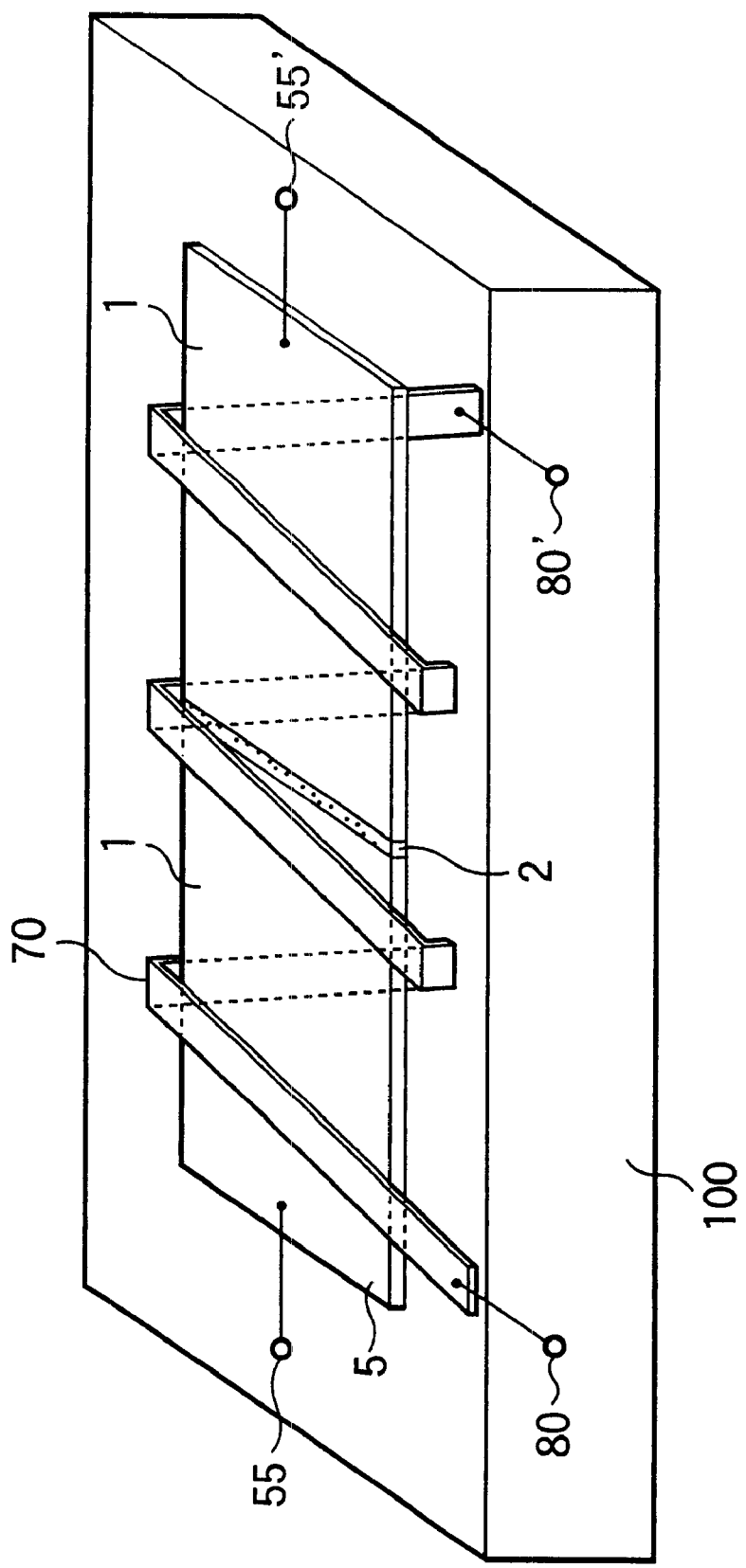
FIG. 21 is an oblique view showing a thin-film magnetic field sensor element according to an eleventh embodiment of the present invention, which includes a thin-film coil.

FIG. 21 is an oblique view showing a thin-film magnetic field sensor according to an eleventh embodiment of the present invention, which includes a thin-film coil. A sensor-basic element 5 is formed of a giant-magneto-resistant thin-film 2 and two soft magnetic thin-films 1 sandwiching the film 2. A conductive thin-film 70 made of, e.g., copper, is wound around the sensor-basic element 5. These members are formed by a sequential thin-film process. For example, on a substrate 100, the part of the conductive thin-film 70 under the sensor-basic element 5 is first formed like crossties, suitably using photo-resist and sputtering. Then, an insulating film of, e.g., $SiO_2$ is formed by sputtering to fill the gaps between the crossties and cover the top of the crossties. Since the top surface of the $SiO_2$ is uneven in accordance with the crosstie pattern when the $SiO_2$ is formed, the surface of the $SiO_2$ is planalized by lapping. Then, the soft magnetic thin-films 1 and the giant-magneto-resistant thin-film 2 are formed thereon, using photo-resist and sputtering. The end portions of the conductive thin-film 70 are formed like pillars with conductive films stacked by sputtering. Then, an insulating film is formed thereon by sputtering. Furthermore, the upper part of the conductive thin-film 70 is formed thereon by sputtering.

Twelfth Embodiment

Figure 22:
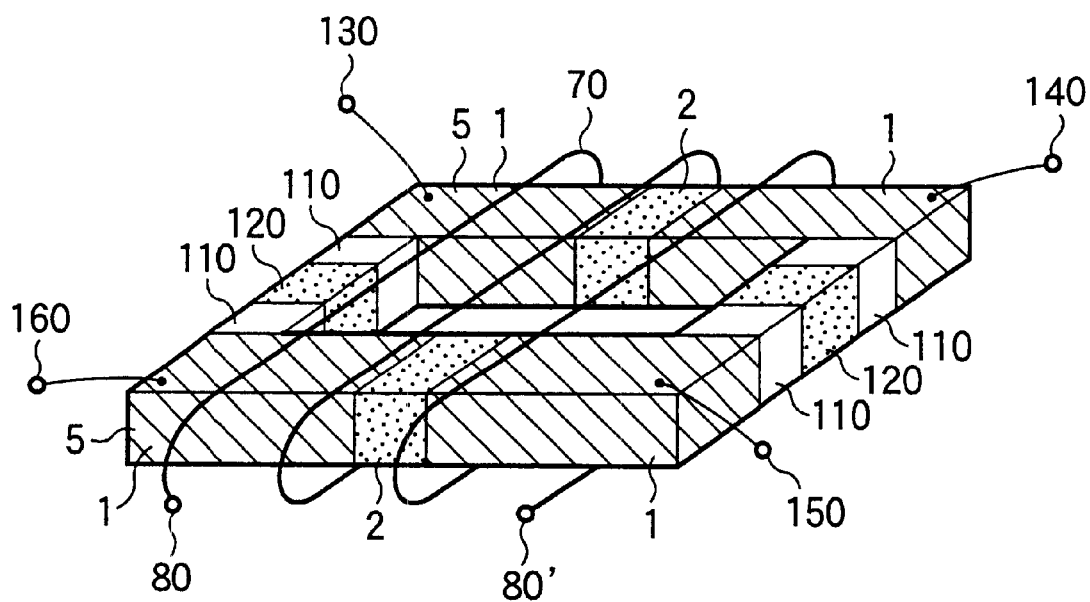
FIG. 22 is an oblique view showing a thin-film magnetic field sensor according to a twelfth embodiment, which includes a coil and electrical terminals forming arms of a bridge circuit.

FIG. 22 is an oblique view showing a thin-film magnetic field sensor element according to a twelfth embodiment. In this case, two sensor-basic elements 5 are used. Giant-magneto-resistant thin-films 120 are formed via conductive films 110 between the terminals of the sensor-basic elements 5. Terminals 130, 140, 150, and 160 are respectively connected to soft magnetic thin-films. Of the terminals, the terminals 130 and 150 are used as input terminals between which a constant voltage is applied, and the terminals 140 and 160 are used as output terminals, between which the voltage is measured. In other words, an electrical bridge circuit is formed with arms, i.e., the sensor-basic elements 5, and elements, each of which has a giant-magneto-resistant thin-film 120 and two conductive films 110 sandwiching the film 120. The giant-magneto-resistant thin-films 120 are magnetically separated from the soft magnetic thin-films 1, and the resistance value change between the sensor-basic elements appears as it is as the voltage change between the output terminals 140 and 160. A coil 70 and terminals 80 and 80' are formed around the sensor-basic elements.

Thirteenth Embodiment

Figure 23:
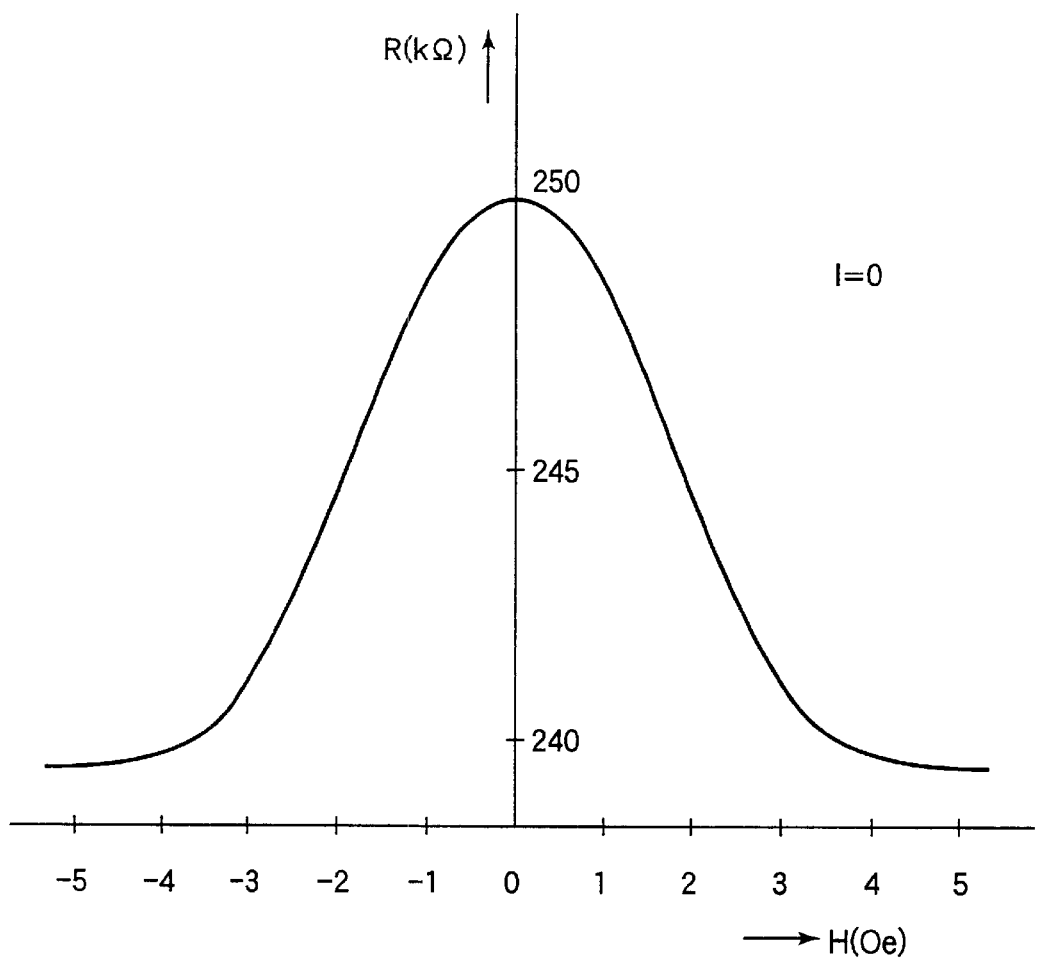
FIG. 23 is a graph showing an example as to how the electrical resistance value changes in accordance with the intensity of the external magnetic field when the coil current is zero in the structure shown in FIG. 20.

FIG. 23 is a graph showing an example as to how the electrical resistance value changes in accordance with the intensity of the external magnetic field when the coil current is zero in the structure shown in FIG. 20.

In the example shown in FIG. 23, the resistance value is about 250 kΩ when the magnetic field intensity is zero, and it gradually decreases with an increase in the magnetic field intensity, and reach about 240 kΩ when the magnetic field intensity is 5 Oe.

Figure 24:
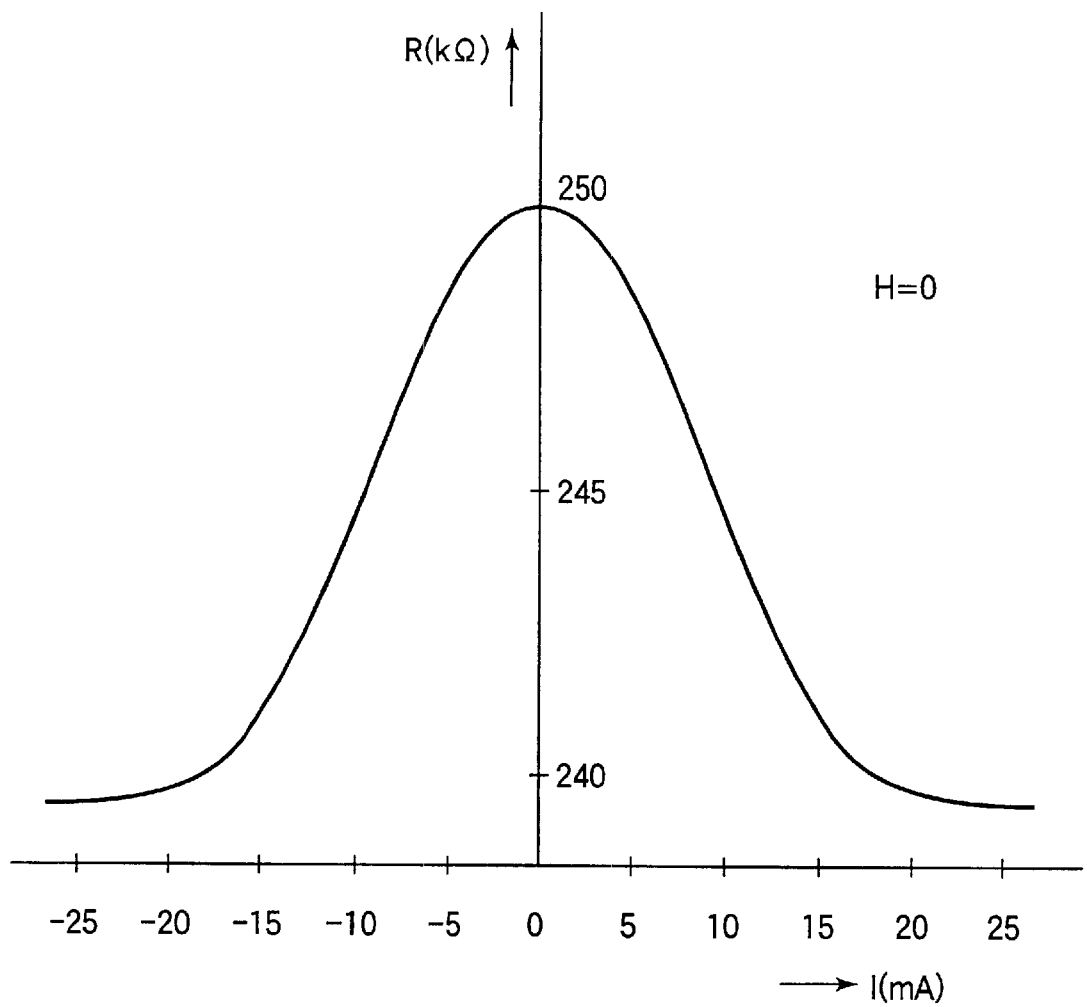
FIG. 24 is a graph showing how the resistance value changes in accordance with the coil current when the intensity of the external magnetic field is zero.

On the other hand, FIG. 24 is a graph showing how the resistance value changes in accordance with the coil current when the intensity of the external magnetic field is zero. FIGS. 23 and 24 almost completely agree with each other, where the horizontal axes are replaced with a dimension to satisfy 1 Oe=5 mA. In other words, the external magnetic field change is almost equivalent to the magnetic field formed by the coil current.

Figure 25:
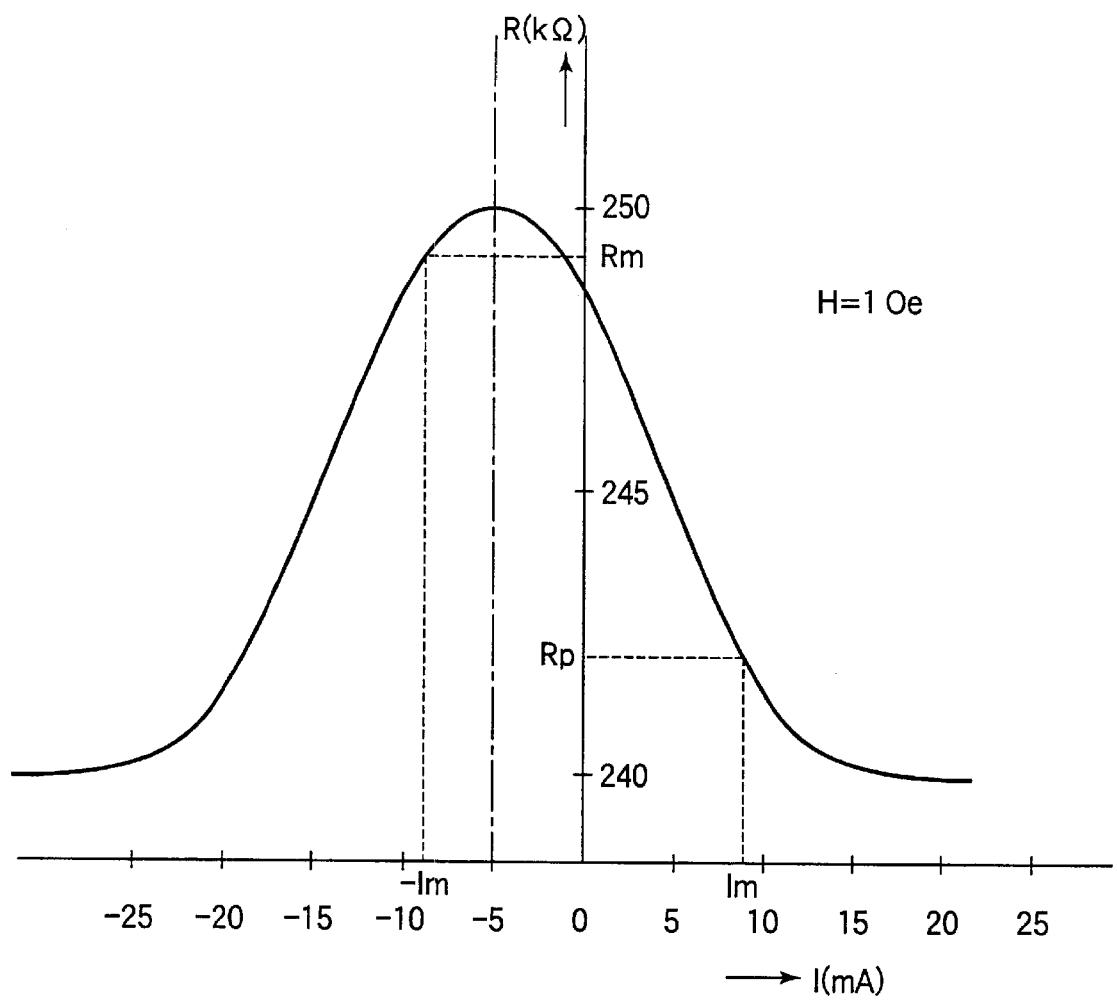
FIG. 25 is a graph showing how the resistance value changes in accordance with the current when the intensity of the external magnetic field is 1 Oe.

FIG. 25 is a graph showing how the resistance value changes in accordance with the current when the intensity of the external magnetic field is 1 Oe. As shown in this graph, a magnetic field intensity of −1 Oe is generated when the current is −5 mA, and thus it totally cancels the external magnetic field. Accordingly, as shown in FIG. 25, this can be regarded as an arrangement having a bias of −5 mA. In this arrangement, if a current Im (8 mA in this case) flows respectively in the positive and negative directions, the resistance value becomes Rp and Rm, respectively. Where the intensity of a magnetic field externally applied falls in a certain range, the amount of the difference between the Rm and Rp is in proportion to the magnetic field intensity.

Figure 26:
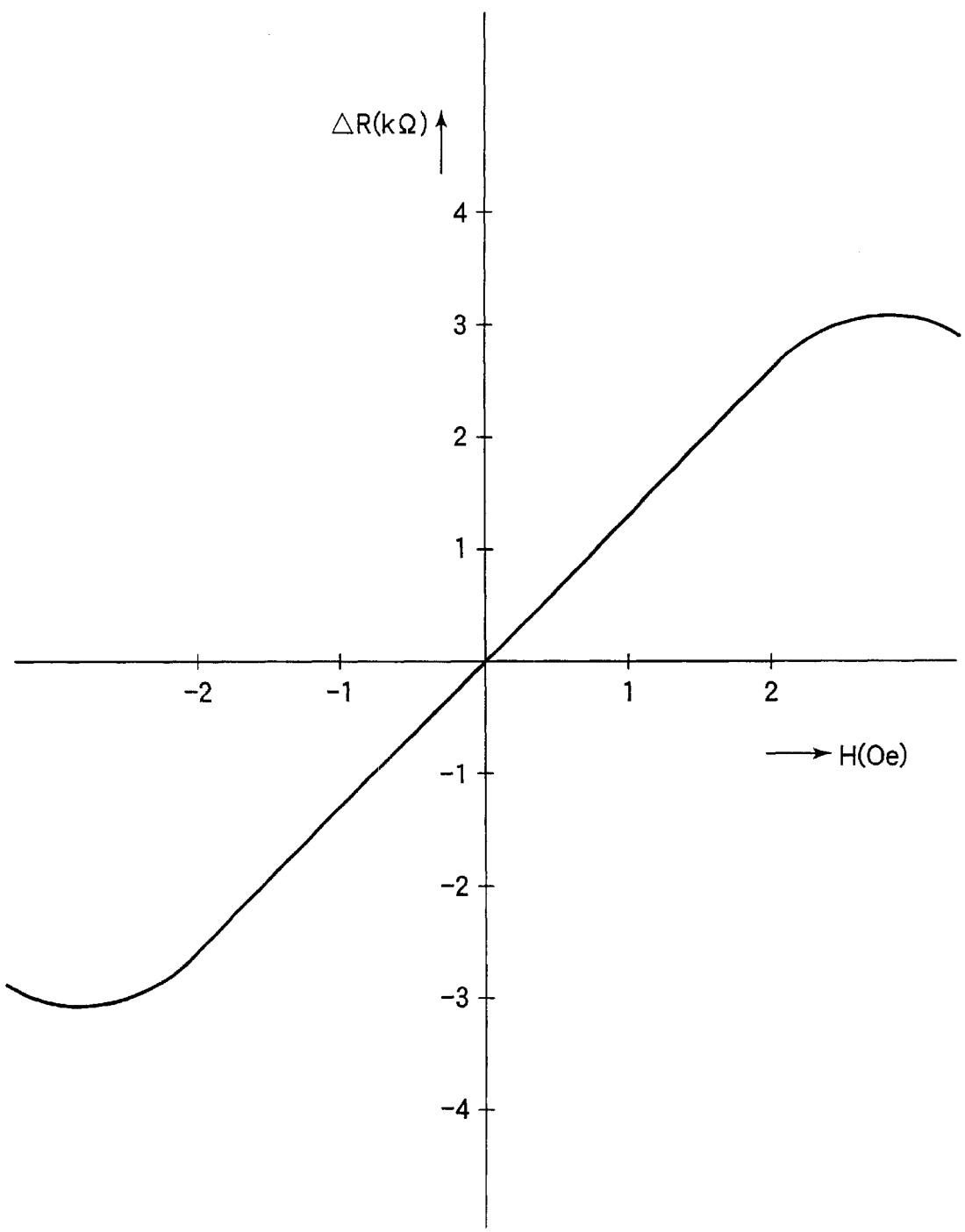
FIG. 26 is a graph showing the relationship between $\Delta R = Rm - Rp$ and the intensity of the external magnetic field in a thirteenth embodiment.

For example, FIG. 26 is a graph showing the relationship between ΔR=Rm−Rp and the intensity of the external magnetic field, in which they have a linear relation in a range between ±2 Oe. It should be noted that, when H is ±2 Oe, Rm−Rp becomes positive and negative, corresponding to H being positive and negative, respectively, i.e., they have a linear relation including the signs. In other words, in accordance with an object of the present invention, it is possible to detect the absolute value of magnetic field intensity and magnetic field direction.

The current value to be used for detecting magnetic field intensity can be chosen, such that a linear portion in the measurement range of magnetic field intensity is maximized by essentially targeting the center of the linearly changing portion in the relationship between the current value and the resistance value in FIG. 24.

Fourteenth Embodiment

This embodiment relates to a method of dealing with a case where residual magnetization remains in soft magnetic thin-films because of some causes. Where a current is caused to flow in a coil to substantially saturate soft magnetic thin-films, so as to deliberately magnetize the soft magnetic material in some direction, the material can be set in a stable state. Even if some residual magnetization remains, where a current is caused to flow in a coil so as to forcedly obtain substantial saturation in some magnetization direction, it can be set in a stable state. Where a current is caused to flow in the opposite direction to obtain substantial saturation, it can be set in a stable state, while being magnetized in the opposite direction. In other words, causing a current to obtain saturation has an effect to entirely remove the past history.

Fifteenth Embodiment

Figure 27:
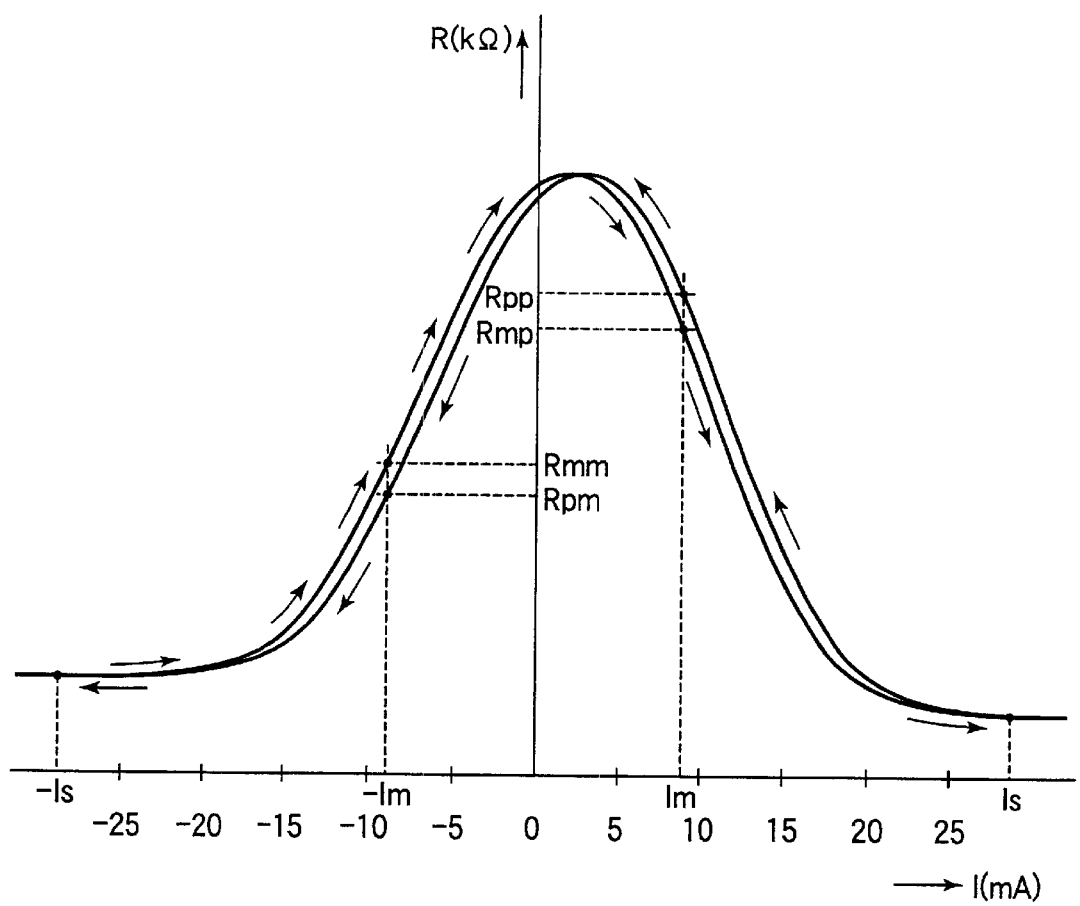
FIG. 27 is a graph explaining a method, which allows measurement of the pure intensity of the external magnetic field, excluding the influence of residual magnetization, according to a fifteenth embodiment.

FIG. 27 is a graph explaining a method, which allows measurement of the pure intensity of the external magnetic field, excluding the influence of residual magnetization. At first, a current value Is is caused to flow to substantially saturate soft magnetic thin-films. After the Is flows, the current is continuously reduced to a current value +Im that does not saturate the soft magnetic thin film. It means that an operation is performed to go along an arrow from Is to Im in FIG. 27. At the point, a resistance value Rpp is measured. Then, the current value is continuously changed from +Im to −Im. At the point, a resistance value Rpm is taken. Then, a current value Is is caused to flow in the opposite direction to obtain substantial saturation. After the −Is flows, the current value is gradually reduced toward zero, and at a current value of −Im, a resistance value Rmm is taken. Then, the current is continuously changed from −Im to +Im, and Rpm is measured. The operation described above corresponds to movement exactly on the boundary of a hysteresis curve of so called a BH curve, and thus the influence of residual magnetization that a soft magnetic material has held is entirely canceled. Based on resistance values thus obtained, the difference between (Rpm+Rmm)/2 and (Rpp+Rmp)/2 is derived, so that the pure intensity of the external magnetic field can be measured while removing the influence of the residual magnetization.

According to the tenth to fifteenth embodiments described above, the degree and direction of a magnetic field can be accurately measured while removing measurement errors due to residual magnetization.

Industrial Applicability

According to the present invention described above, since only electrical resistance value change due to a magnetic field is outputted from a bridge circuit, the degree of the magnetic field can be accurately measured.

Where a bias magnetic field is applied to a magnetic field sensor section, the direction of a magnetic field can be determined when the degree of the magnetic field is measured. Particularly, with a thin-film magnetic field sensor according to the present invention, in which a coil is disposed around soft magnetic thin-films and a giant-magneto-resistant thin-film, and electrical terminals form a part of a bridge circuit, the degree and direction of a magnetic field can be accurately measured while removing measurement errors due to residual magnetization in the soft magnetic thin-films and the giant-magneto-resistant thin-film.

Since a thin-film magnetic field sensor according to the present invention can be simple in structure and compact, it can be utilized as a magnetic field sensor with a high accuracy and a high resolution, or an azimuth sensor or an angle sensor, which needs to specify the direction of a magnetic field.

What is claimed is:

1. A thin-film magnetic field sensor comprising:
    a first element including soft magnetic thin-films, which are separated by a gap having a predetermined gap length, and each have a predetermined film thickness and a predetermined width at a portion in contact with the gap, a giant-magneto-resistant thin-film formed to fill the gap between the soft magnetic thin-films, and first and second terminals respectively and electrically connected to the two separated soft magnetic thin-films;
    a second element including conductive films, which are separated by a gap having a gap length substantially equal to said gap length, and each have a film thickness substantially equal to said film thickness and a width substantially equal to said width at a portion in contact with the gap, a giant-magneto-resistant thin-film formed to fill the gap between the conductive films, and first and second terminals respectively and electrically connected to the two separated conductive films;
    wherein the first terminal of the first element is connected to one end of a first resistor,
    the other end of the first resistor is connected to one end of a second resistor,
    the other end of the second resistor is connected to the first terminal of the second element, and
    the second terminal of the second element is connected to the second terminal of the first element, to form a bridge circuit, and
    a predetermined voltage is applied between the first terminal of the first element and the first terminal of the second element, and a magnetic field is detected based on a voltage between the second terminal of the first element and said other end of the first resistor.

2. A thin-film magnetic field sensor according to claim 1, wherein:
    the first resistor is a third element including conductive films, which are separated by a gap having a gap length substantially equal to said gap length, and each have a film thickness substantially equal to said film thickness and a width substantially equal to said width at a portion in contact with the gap, a giant-magneto-resistant thin-film formed to fill the gap between the conductive films, and first and second terminals respectively and electrically connected to the two separated conductive films;
    the second resistor is a fourth element including soft magnetic thin-films, which are separated by a gap having a gap length substantially equal to said gap length, and each have a film thickness substantially equal to said film thickness and a width substantially equal to said width at a portion in contact with the gap, a giant-magneto-resistant thin-film formed to fill the gap between the soft magnetic thin-films, and first and second terminals respectively and electrically connected to the two separated soft magnetic thin-films; and
    the first terminal of the first element is connected to the first terminal of the third element,
    the second terminal of the third element is connected to the first terminal of a fourth element,
    the second terminal of the fourth element is connected to the first terminal of the second element, and
    the second terminal of the second element is connected to the second terminal of the first element, to form a bridge circuit, and a predetermined voltage is applied between the first terminal of the first element and the first terminal of the second element, and a magnetic field is detected based on a voltage between the second terminal of the first element and the second terminal of the third element.

3. A thin-film magnected field sensor according to claim 1, wherein:

the conductive films; and the conductive films have a surface area in a plan view which is 1/10 or less a surface area of the soft magnetic thin-films in the plan view.

4. A thin-film magnetic field sensor according to claim 1, wherein the soft magnetic thin-films at least partly have a width measured along a line parallel to a line in contact with the gap, which is larger than the width of the soft magnetic thin-films in contact with the gap.

5. A thin-film magnetic field sensor according to claim 1, wherein the soft magnetic thin-films have a magnetic property of uniaxial anisotropy, whose magnetization-easy axis direction is substantially parallel to a line in contact with the gap.

6. A thin-film magnetic field sensor comprising:

a magnetic field sensor element including soft magnetic thin-films, which are separated by a gap having a predetermined gap length, and each have a predetermined film thickness and a predetermined width at a portion in contact with the gap, a giant-magneto-resistant thin-film formed to fill the gap, and electrical terminals respectively and electrically connected to the two separated soft magnetic thin-films; and a magnetic field generator configured to apply a bias magnetic field to the magnetic field sensor element for arbitrarily shifting a magnetic field zero point in an electrical resistance change curve, wherein the magnetic field sensor element detects a degree and polarity of an external magnetic field together from the electrical terminals, using the bias magnetic field.

7. A thin-film magnetic field sensor according to claim 6, wherein the magnetic field generator comprises hard magnetic films which are respectively formed in contact with said soft magnetic thin-films to form a multi-layered film.

8. A thin-film magnetic field sensor according to claim 6, wherein the magnetic field generator comprises anti-ferromagnetic films which are respectively formed in contact with said soft magnetic thin-films to form a multi-layered film.

9. A thin-film magnetic field sensor according to claim 6, wherein the magnetic field generator comprises a hard magnetic material member or an anti-ferromagnetic material member disposed outside the magnetic field sensor element.

10. A thin-film magnetic field sensor according to claim 6, wherein the magnetic field generator comprises a hard magnetic film or an anti-ferromagnetic film disposed outside the magnetic field sensor element.

11. A thin-film magnetic field sensor according to claim 6, wherein the magnetic field generator comprises a conductive member disposed in contact with or near the magnetic field sensor element, or a coil formed of a conductive member disposed in contact with or near the magnetic field sensor element, and the magnetic filed generator generates the bias magnetic field by supplying a current to the conductive member or the coil.

12. A thin-film magnetic field sensor according to claim 6, wherein the magnetic field generator comprises a conductive thin-film disposed in contact with or near the magnetic field sensor element, or a coil comprising a conductive thin-film disposed in contact with or near the magnetic field sensor element, and the magnetic field generator generates the bias magnetic field by supplying a current to the conductive thin-film or the coil.

13. A thin-film magnetic field sensor according to claim 6, wherein the magnetic field generator includes a conductive coil wound around the soft magnetic thin-films and the giant-magneto-resistant thin-film of the magnetic field sensor element.

14. A thin-film magnetic field sensor according to claim 13, wherein electrical terminals form one arm of a bridge circuit, and measurement of a resistance value between electrical terminals is performed by measurement of a bridge output voltage.

15. A thin-film magnetic field sensor according to claim 13, wherein the coil comprises a conductive thin-film.

16. A thin-film magnetic field sensor according to claim 13, wherein currents caused to flow in the coil comprise two currents in positive and negative directions, which have substantially the same absolute value within a range where magnetization of the soft magnetic thin-films does not reach saturation, and the absolute value and polarity of the intensity of a magnetic field around the magnetic field sensor are determined by a difference (Rm–Rp), where Rp is a resistance value between the electrical terminals when the positive direction current flows, and Rm is a resistance value between the electrical terminals when the negative direction current flows.

17. A thin-film magnetic field sensor comprising:

a magnetic field sensor element including soft magnetic thin-films, which are separated by a gap having a predetermined gap length, and each have a predetermined film thickness and a predetermined width at a portion in contact with the gap, a giant-magneto-resistant thin-film formed to fill the gap, and electrical terminals respectively and electrically connected to the two separated soft magnetic thin-films;

a coil wound around the soft magnetic thin-films and the giant-magneto-resistant thin-film of the magnetic field sensor element; and means for supplying a current to the coil, wherein current values caused to flow in the coil include a current value which substantially saturates magnetization of the soft magnetic thin-films.

18. A thin-film magnetic field sensor comprising:

a magnetic field sensor element including soft magnetic thin-films, which are separated by a gap having a predetermined gap length, and each have a predetermined film thickness and a predetermined width at a portion in contact with the gap, a giant-magneto-resistant thin-film formed to fill the gap, and electrical terminals respectively and electrically connected to the two separated soft magnetic thin-films;

a coil wound around the soft magnetic thin-films and the giant-magneto-resistant thin-film of the magnetic field sensor element; and means for supplying a current to the coil, wherein an absolute value and polarity of the intensity of a magnetic bold around the magnetic field sensor are determined by performing the following operations in order:

(1) supplying electric current to the coil, while setting the electric current to be a positive current which substantially saturates magnetization of the soft magnetic thin-films;

(2) reducing a value of the electric current to supply a predetermined positive current within a range which does not provide saturation, and measuring a resistance value Rpp between the terminals at this time;

(3) changing the electric current from the predetermined positive current to a predetermined negative current, and measuring a resistance value Rpm between the terminals at this time;

(4) supplying electric current to the coil, while setting the electric current to be a negative current which substantially saturates magnetization of the soft magnetic thin-films;

(5) reducing the value of the electric current to supply a predetermined negative current within a range which does not provide saturation, and measuring a resistance value Rmm between the terminals at this time;

(6) changing the electric current from the predetermined negative current to a predetermined positive current, and measuring a resistance value Rmp between the terminals at this time; and (7) calculating ((Rpm+Rmm)/2−(Rpp+Rmp)/2), based on the resistance values thus obtained.

19. A thin-film magnetic field sensor comprising a bridge circuit and a coil wound around the bridge circuit, the bridge circuit comprising:

a first sensor-basic element including soft magnetic thin-films, which are separated by a gap having a predetermined gap length, and each having a predetermined film thickness and a predetermined width at a portion in contact with the gap, a giant-magneto-resistant thin-film formed to fill the gap between the soft magnetic thin-films, and first and second terminals respectively and electrically connected to the two separated soft magnetic thin-films;

a second sensor-basic element including soft magnetic thin-films, which are separated by a gap having a predetermined gap length, and each having a predetermined film thickness and a predetermined width at a portion in contact with the gap, a giant-magneto-resistant thin-film formed to fill the gap between the soft magnetic thin-films, and first and second terminals respectively and electrically connected to the two separated soft magnetic thin-films;

a first intermediate element including a first conductor electrically connected to the first terminal of the first sensor-basic element, a second conductor electrically connected to the first terminal of the second sensor-basic element, and a giant-magneto-resistant thin-film disposed between and in contact with the first and second conductors; and a second intermediate element including a first conductor electrically connected to the second terminal of the first sensor-basic element, a second conductor electrically connected to the second terminal of the second sensor-basic element, and a giant-magneto-resistant thin-film disposed between and in contact with the first and second conductors.

* * * * *